US006972458B2

(12) United States Patent
Suzuki et al.

(10) Patent No.: US 6,972,458 B2
(45) Date of Patent: Dec. 6, 2005

(54) HORIZONTAL MOS TRANSISTOR

(75) Inventors: Naohiro Suzuki, Anjo (JP); Jun Sakakibara, Anjo (JP); Yoshitaka Noda, Bisai (JP); Hitoshi Yamaguchi, Nisshin (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/729,955

(22) Filed: Dec. 9, 2003

(65) Prior Publication Data
US 2004/0119091 A1 Jun. 24, 2004

(30) Foreign Application Priority Data

Oct. 7, 2003 (JP) .......................... 2003-348865
Dec. 18, 2003 (JP) .......................... 2002-367067

(51) Int. Cl.[7] ............................................ H01L 29/732
(52) U.S. Cl. ..................... 257/330; 257/328; 257/329; 257/343
(58) Field of Search ................................. 257/328–330, 257/335, 336–338, 343

(56) References Cited

U.S. PATENT DOCUMENTS

| 5,640,034 | A | * | 6/1997 | Malhi | ......................... 257/341 |
|---|---|---|---|---|---|
| 6,118,149 | A | | 9/2000 | Nakagawa et al. | ......... 257/330 |
| 6,163,051 | A | * | 12/2000 | Nakagawa et al. | ......... 257/331 |
| 6,278,155 | B1 | * | 8/2001 | Okabe et al. | ................ 257/328 |
| 6,452,231 | B1 | | 9/2002 | Nakagawa et al. | |
| 6,525,375 | B1 | | 2/2003 | Yamaguchi et al. | ......... 257/341 |
| 6,580,101 | B2 | * | 6/2003 | Yoshida | ....................... 257/192 |
| 6,713,814 | B1 | * | 3/2004 | Koscielniak | ................. 257/330 |
| 6,812,522 | B2 | * | 11/2004 | Ishihara | ....................... 257/330 |
| 6,835,993 | B2 | * | 12/2004 | Sridevan et al. | ............. 257/492 |
| 2003/0141514 | A1 | | 7/2003 | Yamaguchi et al. | ......... 257/107 |

FOREIGN PATENT DOCUMENTS

JP        A-2001-127287        5/2001

* cited by examiner

Primary Examiner—George Eckert
Assistant Examiner—Eugene Lee
(74) Attorney, Agent, or Firm—Posz Law Group, PLC

(57) ABSTRACT

A semiconductor device includes a base P region, a source N+ region, and a drain N+ region formed in a surface layer portion on a principal surface in an N− silicon layer. In the surface layer portion on the principal surface, an N well region is formed deeper than the drain N+ region in a region including the drain N+ region and is in contact with the base P region. A trench is formed so as to penetrate the base P region in a direction toward the drain N+ region from the source N+ region as a planar structure. A gate electrode is formed via a gate insulating film in the inside of the trench.

15 Claims, 28 Drawing Sheets

⇐ SURGE PATH

HORIZONTAL MOS TRANSISTOR

CROSS REFERENCE TO RELATED APPLICATIONS

This application is based upon, claims the benefit of priority of, and incorporates by reference the contents of Japanese Patent Application No. 2002-367067 filed Dec. 18, 2002 and Japanese Patent Application No. 2003-348865 filed Oct. 7, 2003.

FIELD OF THE INVENTION

The present invention relates to a semiconductor device, and, more particularly, to a horizontal MOS transistor.

BACKGROUND OF THE INVENTION

A semiconductor device such as that disclosed in JP-A-2001-274398 has a structure as shown in FIGS. 40A–40B. A base P region 101 is formed in a surface layer portion on a principal surface 100a in an N⁻ silicon substrate 100, and a source N⁺ region 102 is formed in a surface layer portion on the principal surface 100a inside the base P region 101. Moreover, an N⁺ region 103 is formed apart from the base P region 101 in the surface layer portion on the principal surface 100a. In addition, a trench 104 is formed in the principal surface 100a of the N⁻ silicon substrate 100 to penetrate the base P region 101 in a direction toward the drain N⁺ region 103 from the source N⁺ region 102 as a planar structure thereof. In the inside of the trench 104, a gate electrode (not shown) is formed via a gate insulating film (not shown). A source electrode (not shown) is electrically connected to the source region 102, and a drain electrode (not shown) is electrically connected to the drain region 103.

With such a structure, an electric current passage can be extended in a depth direction in a trench gate, and an ON resistance can be reduced.

However, taking measures against a surge into account, there is the following problem to be solved. A surge penetrating from the drain N⁺ region 103 flows up to a deep portion of the N⁻ silicon substrate 100, and penetrates into the base P region 101 from a corner portion of the base P region 101 where electric fields tend to concentrate. Then, the surge flows in a vertical direction in the base P region 101 to reach the ground from the source electrode. Therefore, since a resistance in the vertical direction of the base P region 101 acts as a base parasitic resistance to cause a parasitic bipolar transistor, which is constituted by the source N⁺ region 102, the base P region 101, and the N⁻ layer (100), to be easily turned ON, the semiconductor device is susceptible to the surge.

SUMMARY OF THE INVENTION

The present invention has been devised in view of such a background, and it is an object of the invention to provide a semiconductor device, which realizes reduction of an ON resistance and is resistant to a surge, and a method of manufacturing the same.

A first aspect of the invention is a semiconductor device that is provided with a trench. The trench is formed from a principal surface of a semiconductor substrate to penetrate a base region in a direction toward a drain region from a source region as a planar structure thereof. Thus, by adopting a trench gate structure, an electric current passage can be extended in a depth direction, and the ON resistance can be reduced. In addition, the semiconductor device is also provided with a well region. The well region includes the drain region in a surface layer portion on the principal surface. The well region is formed deeper than the drain region and with a higher concentration than the semiconductor substrate in a region in contact with the base region, and has a first conductivity type. Thus, a surge having penetrated from the drain region penetrates into the well region and flows on a surface side of the base region through the well region having a low resistance to be absorbed in the ground by a source electrode. Therefore, since the surge never flows in a vertical direction in the base region, a parasitic resistance of the base region decreases, and the semiconductor device becomes resistant to the surge.

A second aspect of the invention is a semiconductor device which is provided with a trench. The trench is formed from a principal surface of a semiconductor substrate to penetrate a base region in a direction toward a collector region from an emitter region as a planar structure thereof. Thus, by adopting a trench gate structure, an electric current passage can be extended in a depth direction, and the ON resistance can be reduced. In addition, the semiconductor device is also provided with a well region. In a surface layer portion on the principal surface, this well region is formed deeper than the collector region and with a higher concentration than the semiconductor substrate in a region including the collector region and is in contact with the base region. The well region has a first conductivity type. Thus, a surge having penetrated from the collector region penetrates the well region and flows on a surface side of the base region through the well region having a low resistance to be absorbed in the ground by an emitter electrode. Therefore, since the surge never flows in a vertical direction in the base region, a parasitic resistance of the base region decreases, and the semiconductor device becomes resistant to the surge.

In a third aspect of the invention, in the semiconductor device of the first or the second aspect of the invention, at least in the surface layer portion on the principal surface in the base region, a base contact region of a second conductivity type, which is shallower and has a higher concentration than the base region, is formed between the source region or the emitter region and the drain region or the collector region. Consequently, as shown in FIG. 38, there is little parasitic resistance in a horizontal direction in the base region at the time when a surge penetrates. Thus, an increase in a base potential is small, and a parasitic diode between the base region and the source region or the emitter region operates less easily. As a result, a parasitic bipolar transistor constituted by the substrate, the base region, and the source region or the emitter region operates less easily, whereby concentration of electric currents can be prevented.

In a fourth aspect of the invention, in the semiconductor device in any one of the first to the third aspects of the invention, the concentration increases continuously from a bottom to a surface in the well region. Then, a surge is flown to the surface of the well region, whereby it becomes easy to flow the surge to a surface of the base region, and a path of the surge in the base region is shortened. Consequently, a parasitic base resistance can be reduced to suppress an increase in a potential of the base region, and a surge current capacity can be improved.

In a fifth aspect of the invention, in the semiconductor device in the third aspect of the invention, the base contact region is formed apart from the trench, and a gate electrode is formed on the principal surface via a gate insulating film. Then, a region operating as a channel can be formed on the principal surface of the semiconductor substrate to decrease the ON resistance.

In a sixth aspect of the invention, in the semiconductor device in any one of the first to the fifth aspects, the semiconductor device has an embedded layer of a first conductivity type, which has a higher concentration than the semiconductor substrate, in a bottom of the semiconductor substrate, and a bottom surface corner portion of the trench is made deeper than the well region and shallower than the embedded layer. Then, the vicinity of the bottom surface corner portion of the trench where electric fields tend to concentrate can be turned into a region with a low impurity concentration to prevent the concentration of electric fields and improve a withstand voltage.

In a seventh aspect of the invention, in the semiconductor device in any one of the first to the sixth aspects, a gate electrode is arranged in an opening of the source region or the emitter region on a side of the trench. Then, the semiconductor device becomes preferable for practical use.

In an eighth aspect of the invention, in the semiconductor device in any one of the first to the fifth and the seventh aspects, an SOI substrate is used, and the trench is formed to reach an embedded insulating film of the SOI substrate. Then, a trench for device separation and a trench for gate can be created simultaneously.

In a ninth aspect of the invention, in the semiconductor device in any one of the first to the fifth, the seventh, and the eighth aspects, an SOI substrate is used, and a thickness of a semiconductor layer on an embedded insulating film in the SOI substrate is made equal to a depth of the well region. Then, by reducing a film thickness of the semiconductor layer as much as possible, a depth of a trench for device separation can be reduced, and cost for etching in creating the trench by etching can be reduced.

In a tenth aspect of the invention, in the semiconductor device in any one of the first to the ninth aspects, the drain region or a collector region and the well region form an island shape, and the base region exists around the regions. Then, the semiconductor device is preferable in improving a surge current capacity.

In an eleventh aspect of the invention, in the semiconductor device in any one of the first to the ninth aspects, a source cell or an emitter cell and a drain cell or a collector cell are arranged alternately lengthwise and crosswise adjacent to each other. Then, the semiconductor device is preferable for practical use.

In a twelfth aspect of the invention, in the semiconductor device in any one of the first to the ninth aspects, at least a source contact or an emitter contact in an outermost circumference in a group of cells provided in parallel adjacent to each other are set larger in size than inner source contacts or emitter contacts. Then, the semiconductor device is preferable in improving a surge current capacity.

In a thirteenth aspect of the invention, in the semiconductor device in any one of the first to the ninth aspects, a base contact region of a second conductivity type having a higher concentration than the base region is formed in at least the surface layer portion on the principal surface in the base region in a position, where at least the source region or an emitter region in an outermost circumference in a group of cells provided in parallel adjacent to each other is planned to be arranged, instead of the source region or the emitter region. Then, the semiconductor device is preferable in improving a surge current capacity.

In a fourteenth aspect of the invention, in the semiconductor device in the thirteenth aspect, the drain region or the collector region is surrounded by the source region or the emitter region and the base contact region as a planar structure. Then, the semiconductor device is preferable in improving a surge current capacity.

In a fifteenth aspect of the invention, a method of manufacturing the semiconductor device in the fifth aspect of the invention is provided, which comprises: arranging an insulating film, in which a region where a base contact is planned to be formed is opened as a contact hole, on the principal surface after forming the base region, the source region, the drain region, the well region, and the trench, and performing ion implantation using the insulating film as a mask to form a base contact region apart from the trench in the surface layer portion on the principal surface. Thus, an impurity for forming the base contact region is prevented from diffusing to reach the trench.

In a sixteenth aspect of the invention, a method of manufacturing the semiconductor device in the fifth aspect of the invention is provided, which comprises: arranging an insulating film, in which a region where a base contact is planned to be formed is opened as a contact hole, on the principal surface after forming the base region, the emitter region, the collector region, the well region, and the trench; and performing ion implantation using the insulating film as a mask to form a base contact region apart from the trench in the surface layer portion on the principal surface. Thus, an impurity for forming the base contact region is prevented from diffusing to reach the trench.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The above and other objects, features and advantages of the present invention will become more apparent from the following detailed description made with reference to the accompanying drawings. In the drawings.

DESCRIPTION OF THE PREFERRED EMBODIMENTS

First embodiment

A first embodiment in which the present invention is embodied will be hereinafter described in accordance with the accompanying drawings.

Figure 1:
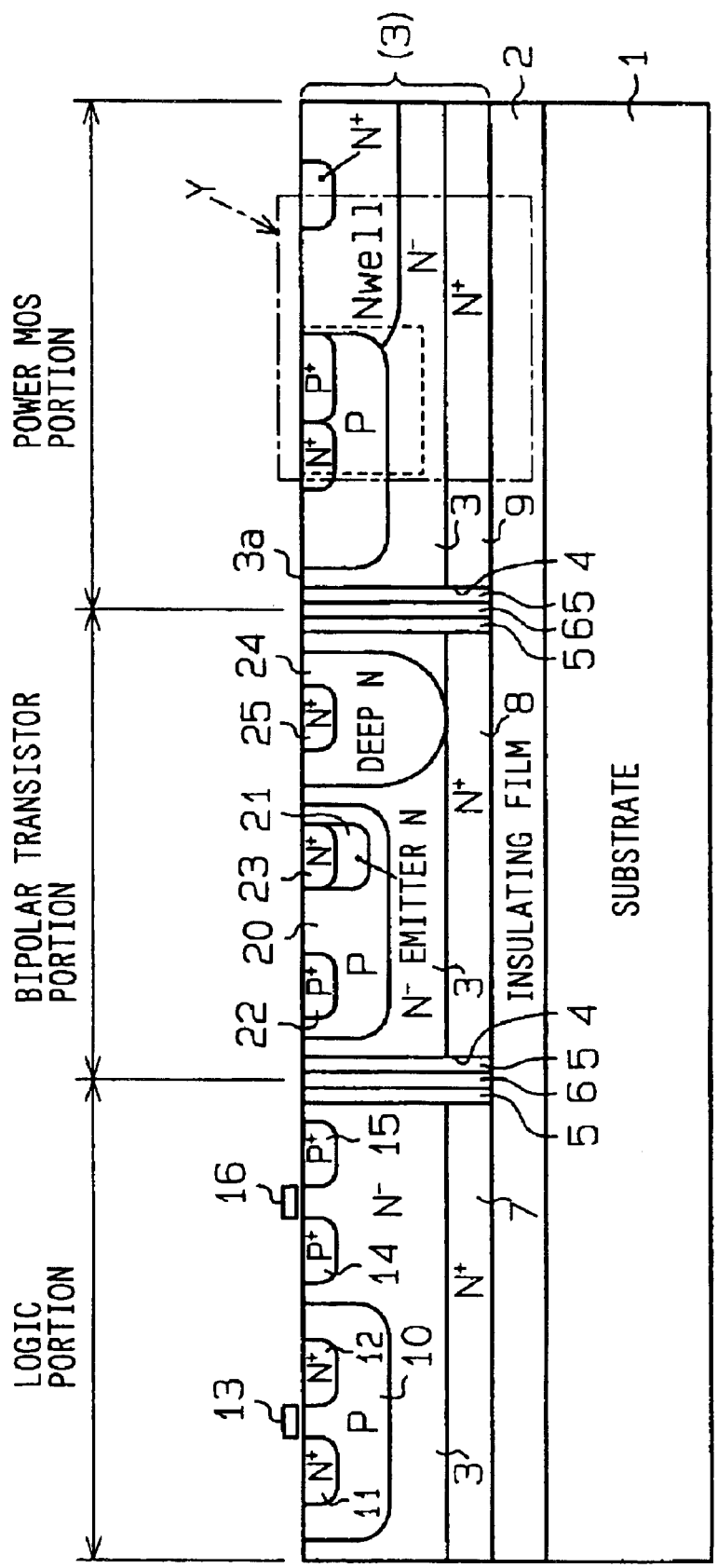
FIG. 1 is a longitudinal sectional view of a semiconductor device in an embodiment.

FIG. 1 shows a longitudinal section of a semiconductor device in this embodiment. In this embodiment, an SOI substrate is used. More particularly, a thin monocrystal silicon layer (monocrystal semiconductor layer) 3 is formed on a silicon substrate 1 via an insulating film (silicon oxide film) 2 to constitute the SOI substrate. In the monocrystal silicon layer 3, trenches for device separation 4 reaching the insulating film 2 are formed. A large number of device formation islands are sectioned and formed by this trench 4. Concerning the trenches for device separation 4, silicon oxide films 5 are formed on sides of the trenches 4, and polysilicon films 6 are filled inside the silicon oxide films 5. In FIG. 1, a first device formation island is a logic portion, in which a CMOS transistor is formed. In addition, a second device formation island is a bipolar transistor portion, in which an NPN transistor is formed. A third device formation island is a power MOS portion, in which a horizontal power MOS transistor (trench gate type LDMOS) is formed.

In addition, in the respective island (the first to the third device formation island in FIG. 1), embedded $N^+$ layers 7, 8, and 9 with a concentration of about $1.0 \times 10^{19}/cm^3$ are formed in bottoms thereof, and portions above the embedded $N^+$ layers are $N^-$ layers 3 with a concentration of about $1.0 \times 10^{15}/cm^3$. In the following description, an N type is a first conductivity type and a P type is a second conductivity type.

Concerning the CMOS transistor in the logic portion, a P well region 10 is formed for an N channel MOS in a surface layer portion of the $N^-$ silicon layer 3. The P well region 10 is formed to have an impurity concentration of about $1.0 \times 10^{17}/cm^3$. A source $N^+$ region 11 and a drain $N^+$ region 12 are formed apart from each other in a surface layer portion of the P well region 10. In addition, a gate electrode 13 is arranged on the P well region 10 via a gate oxide film (not shown).

As a P channel CMOS, a source $P^+$ region 14 and a drain $P^+$ region 15 are formed apart from each other in the surface layer portion of the $N^-$ silicon layer 3. Moreover, a gate electrode 16 is arranged on the $N^-$ silicon layer 3 via a gate oxide film (not shown).

Concerning the NPN transistor in the bipolar transistor portion, a P well region 20 is formed in the surface layer portion of the $N^-$ silicon layer 3, and an emitter N region 21 and a base $P^+$ region 22 are formed apart from each other in a surface layer portion of the P well region 20. An emitter contact $N^+$ region 23 is formed in the emitter N region 21. In addition, a collector N region (deep N region) 24 is formed apart from the P well region 20 in the surface layer portion of the $N^-$ silicon layer 3. The collector N region (deep N region) 24 reaches the embedded $N^+$ layer 8. An $N^+$ contact region 25 is formed in a surface layer portion of the collector N region (deep N region) 24. The base $P^+$ region 22, the emitter contact $N^+$ region 23, and the $N^+$ contact region 25 have a high concentration ($1.0 \times 10^{20}/cm^3$) and are in contact with a base electrode, an emitter electrode, and a collector electrode, respectively.

Figure 2:
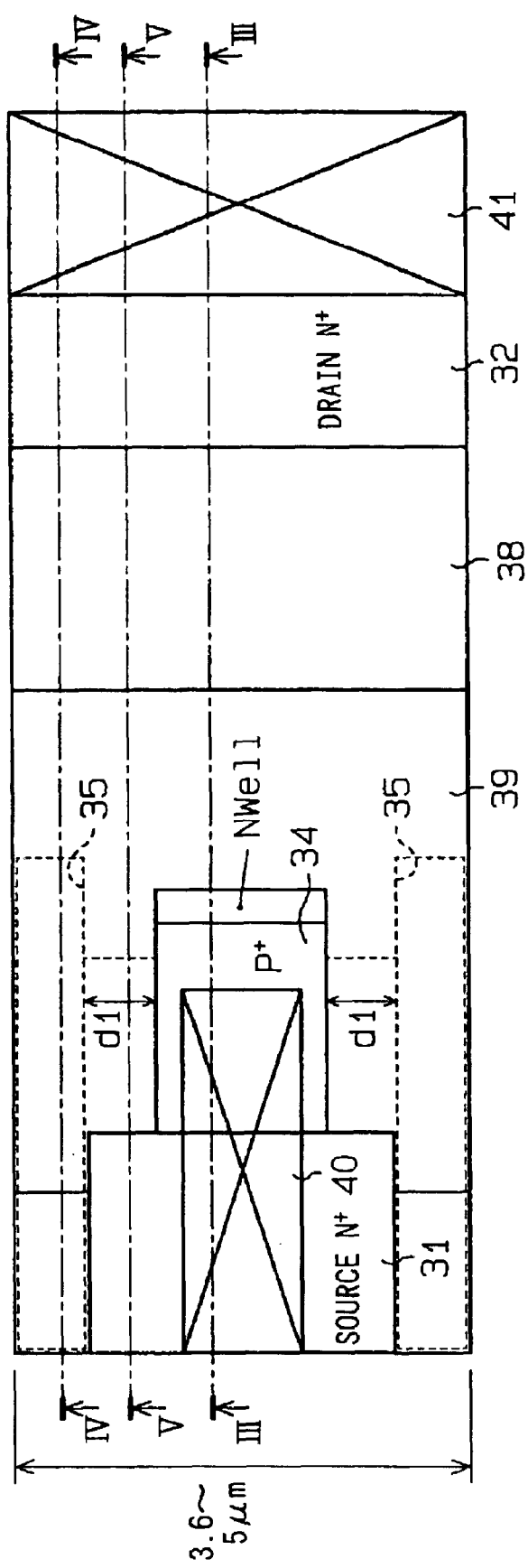
FIG. 2 is a plan view of a horizontal power MOS transistor in a first embodiment.
Figure 3:
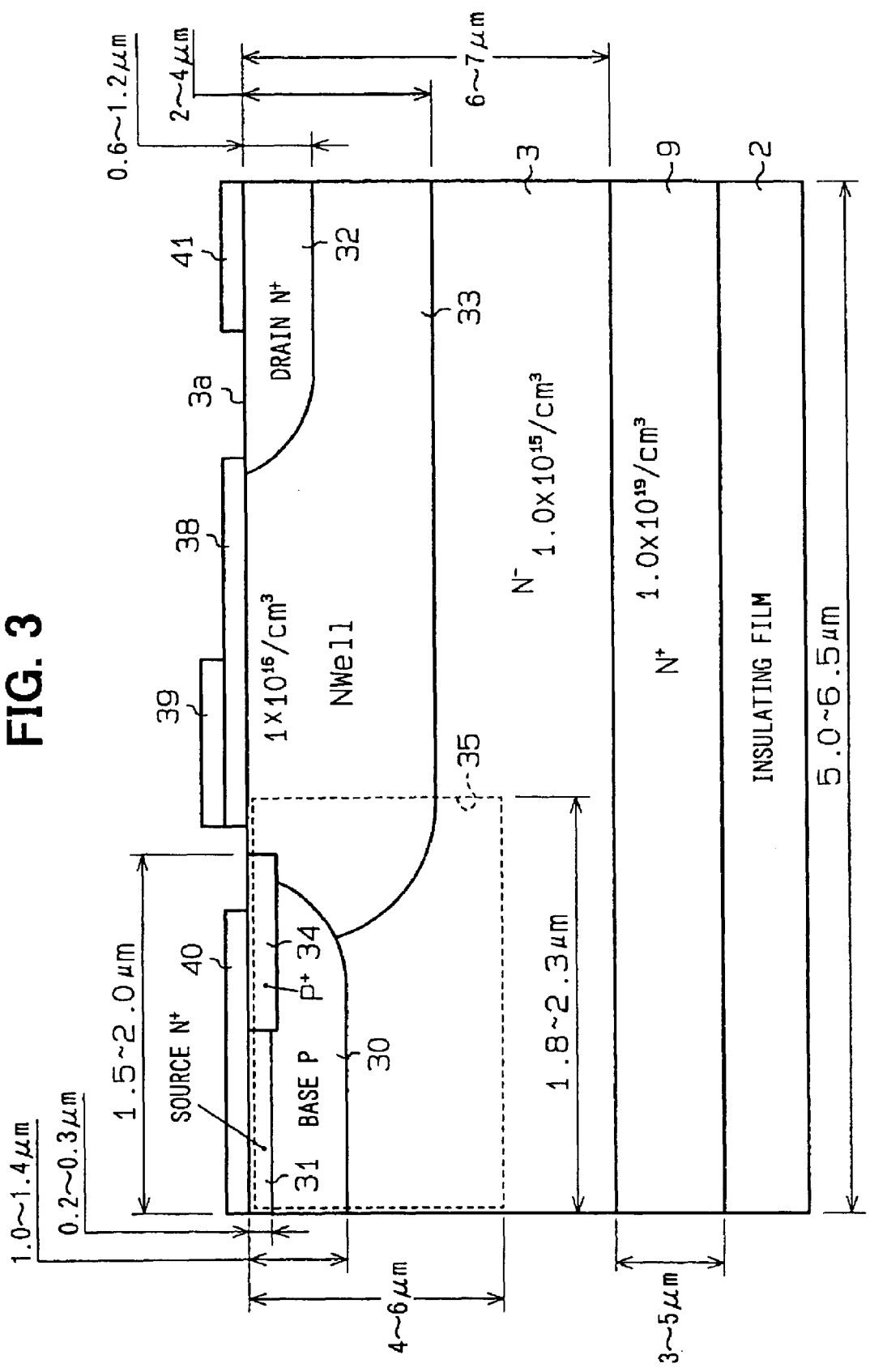
FIG. 3 is a longitudinal sectional view along line III—III of FIG. 2.
Figure 4:
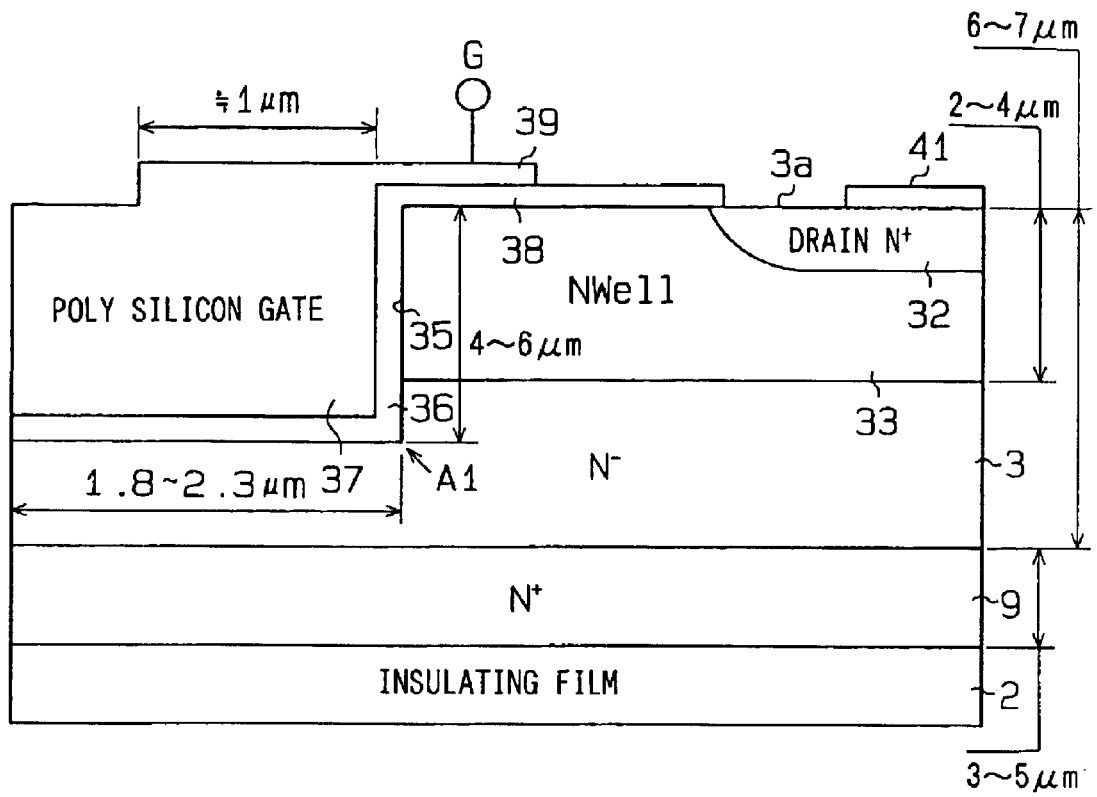
FIG. 4 is a longitudinal sectional view along line IV—IV of FIG. 2.
Figure 5:
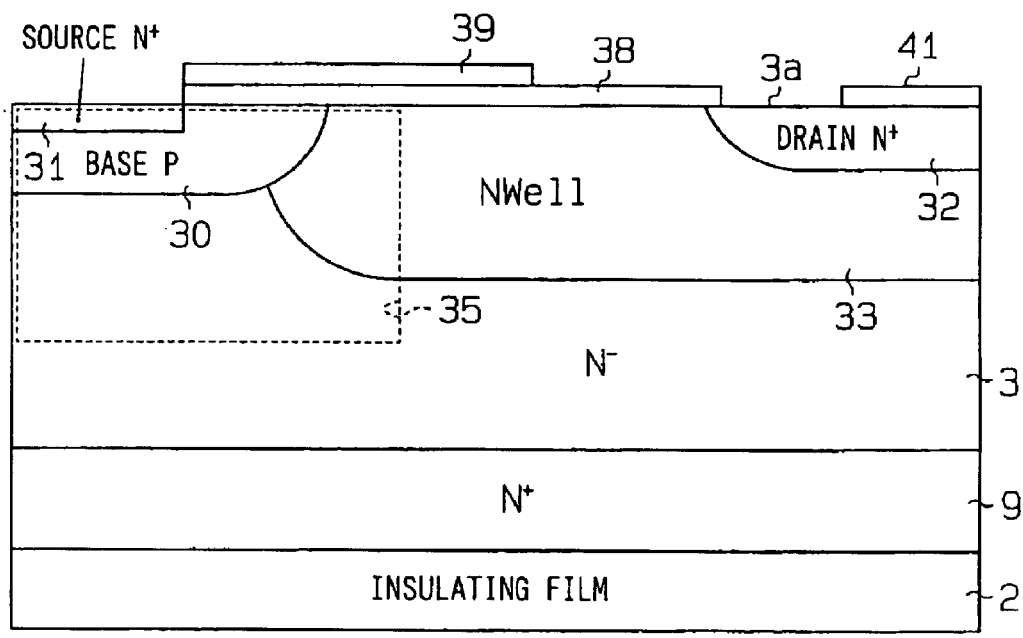
FIG. 5 is a longitudinal sectional view along lie V—V of FIG. 2.

The horizontal MOS transistor in the power MOS portion will be described. Details of a Y portion in FIG. 1 will be described with reference to FIGS. 2, 3, 4, and 5. FIG. 2 is a plan view of the horizontal MOS transistor. FIG. 3 shows a longitudinal sectional view along line III—III of FIG. 2, FIG. 4 shows a longitudinal sectional view along line IV—IV of FIG. 2, and FIG. 5 shows a longitudinal sectional view along V—V of FIG. 2. In this MOS transistor, devices are integrated with the $N^-$ silicon layer 3 as a semiconductor substrate, and an upper surface (3a) of the $N^-$ silicon layer 3 is set as a principal surface of the semiconductor substrate.

As shown in FIGS. 3, 4, and 5, an embedded N⁺ layer 9 having a concentration of about $1.0 \times 10^{19}/cm^3$ is formed in a bottom part in an island, and the N⁻ silicon layer 3 having a concentration of $1.0 \times 10^{15}/cm^3$ is formed in a portion above the embedded N⁺ layer 9.

In FIG. 3, a base P region 30 is formed in a surface layer portion in the N⁻ silicon layer 3 (principal surface 3a of the substrate). A depth of the base P region 30 is 1.0 to 1.4 μm. In addition, a concentration in the base P region 30 continuously increases from a bottom to a surface thereof. More specifically, the concentration is $1.5 \times 10^{17}/cm^3$ on the surface and $1.5 \times 10^{16}/cm^3$ at the depth of 1 μm. Thus, the concentration at the depth of 1 μm is one tenth of that on the surface. Such a concentration gradient can be realized by a generally used semiconductor manufacturing process such as ion implantation or thermal diffusion, whereby the base P region 30 can be manufactured at low cost.

A source N⁺ region 31 is formed shallower than the base P region 30 in the surface layer portion of the N⁻ silicon layer 3 (principal surface 3a of the substrate) in the base P region 30. The source N⁺ region 31 has a surface concentration of $1.0 \times 10^{20}/cm^3$ and a depth of 0.2 to 0.3 μm.

In the surface layer portion in the N⁻ silicon layer 3 (principal surface 3a of the substrate), a drain N⁺ region 32 is formed in a position apart from the base P region 30. The drain N⁺ region 32 has a surface concentration of $1.0 \times 10^{20}/cm^3$ and a depth of 0.6 to 1.2 μm. In a process of forming the drain N⁺ region 32, ion implantation of phosphorus shares a mask with ion implantation for the emitter contact N⁺ region 23 (see FIG. 1) of the bipolar transistor portion. Consequently, the drain N⁺ region 32 can be created without causing an increase in the number of masks.

In the surface layer portion in the N⁻ silicon layer 3 (principal surface 3a of the substrate), an N well region 33 is formed to be deeper than the drain N⁺ region 32 and to have a higher concentration than the N⁻ silicon layer 3 in a region including the drain N⁺ region 32 and in contact with the base P region 30. More specifically, in the N⁻ silicon layer 3, the N well region 33 has a concentration of about $1.0 \times 10^{16}/cm^3$ and is formed to overlap the base P region 30 with a concentration of about $1.0 \times 10^{17}/cm^3$. The N well region 33 has a depth of approximately 2 to 4 μm. In addition, in the N well region 33, a concentration increases continuously from a bottom to a surface thereof.

In the surface layer portion in the N⁻ silicon layer 3 (principal surface 3a of the substrate), in particular, the base P region 30, a base contact P⁺ region 34 is formed further on the drain N⁺ region 32 side than the source N⁺ region 31. The base contact P⁺ region 34 is shallower and has a higher concentration than the base P region 30, and has a surface concentration of $1.0 \times 10^{20}/cm^3$ and a depth of 0.5 μm.

As shown in FIG. 4, a trench 35 is formed in the N⁻ silicon layer 3 (principal surface 3a of the substrate). As a planar structure, the trench 35 is formed to penetrate the base P region 30 as shown in FIG. 5 and in a direction toward the drain N⁺ region 32 from the source N⁺ region 31 as shown in FIG. 2. More particularly, the trench 35 is formed so as to cross the base P region 30 from the source N⁺ region 31 and reach the N well region 33. In addition, as shown in FIG. 2, the base contact P⁺ region 34 is formed apart from the trench 35 by a distance d1. More particularly, there is no base contact P⁺ region 34 in FIG. 5, which is a longitudinal sectional view along line V—V of FIG. 2.

As shown in FIG. 4, a gate electrode 37 is formed via a gate oxide film (gate insulating film) 36 in the inside of the trench 35. More specifically, polysilicon doped with phosphorus is used for the gate electrode 37, and this polysilicon gate electrode 37 is embedded in the trench 35. In addition, as shown in FIG. 5, a polysilicon gate electrode 39 doped with phosphorus is also formed on the substrate surface (principal surface 3a) via a gate oxide film (gate insulating film) 38. As shown in FIG. 4, in the region where the trench 35 is formed, the polysilicon gate electrode 39 arranged on the substrate surface and the polysilicon gate electrode 37 in the trench 35 overlap in a width by about 1 μm. The range of overlap is narrowed in this way (the polysilicon gate electrode 39 is etched and removed as fully as possible in the region where the trench 35 is formed) for placing the gate electrode 39 as far away from the portion above the source N⁺ region 31 as possible as shown in FIG. 5.

As shown in FIG. 3, a source electrode 40 and a drain electrode 41 are formed above the N-silicon layer 3. The source N+ region 31 and the base contact P+ region 34 are electrically connected to the source electrode 40. The drain N+ region 32 is electrically connected with the drain electrode 41.

Since a depth of the trench 35 (gate electrode 37) affects a withstand voltage, it is an important parameter in terms of withstand voltage design. In the vicinity of the trench 35, concentration of electric fields occurs in a corner portion (A1 in FIG. 4). Therefore, the withstand voltage is improved if the electric fields in the vicinity of the corner portion can be relaxed. In order to relax the electric fields in the vicinity of the corner portion, it is sufficient to form a silicon region in the vicinity of the corner portion as a region with a low impurity concentration. Then, a depletion layer easily expands, and the electric fields can be relaxed.

As shown in FIG. 3, in this embodiment, the N well region 33 is embedded in the region of 2 to 4 μm from the surface, and the upper surface of the embedded N⁺ layer 9 is in a position of 6 to 7 μm from the surface and the thickness thereof is 3 to 5 μm. Thus, an impurity concentration is low at $1.0 \times 10^{15}/cm^3$ in a depth of 4 to 6 μm from the surface. Therefore, the depth of the trench 35 is set to 4 to 6 μm. More particularly, the bottom corner portion of the trench 35 is set so as to be deeper than the N well region 33 and shallower than the embedded N⁺ layer 9.

Dependency of the depth of the trench 35 upon a withstand voltage was checked by simulation. As a result, it was found that a device having a withstand voltage of 41 volts at a depth of a trench of 3 μm had an improved withstand voltage of 65 volts at a depth of the trench of 5 μm.

Next, operations of the horizontal power MOS transistor will be described.

At the time when the device is OFF (drain potential: 0.2 volts, gate potential: 7 volt, source potential: 0 volt), since electrons do not reach the base P region 30 from the source N⁺ region 31, an electric current does not flow.

At the time when the device is ON (drain potential: 0.2 volts, gate potential: 7 volts, source potential: 0 volt), an inversion layer is formed in a portion which is in contact with the gate oxide films 36 and 38 in the base P region 30. Then, electrons reach the surface of the trench 35 and the inversion layer on the upper surface of the substrate from the source N⁺ region 31. Next, the electrons reach the N well region 33 from the surface of the trench 35 and the inversion layer on the upper surface of the substrate. At this point, since the depth of the trench 35 is 4 to 6 μm and the depth of the N well region 33 is 2 to 4 μm, the electrons reach the depth of 2 to 4 μm in the N well region 33.

Next, the electrons reach the drain N⁺ region 32 from the N well region 33. In this case, since the depth of the N⁺ region 32 is 0.6 to 1.2 μm, the electrons also exist in a deep portion even as the electrons approach the drain N⁺ region 32.

In this way, a path of the electric current is formed deep into the inside of the silicon layer 3 (or portion distant from the surface). Therefore, the ON resistance can be reduced. More specifically, as a simulation result, it was found that the above configuration achieved an ON resistance was 63.4 m Ω·mm², which was about half compared with a conventional device having only a surface gate without using a trench gate.

Next, operations in the case in which an electrostatic surge has penetrated into the semiconductor device will be described with reference to FIGS. 6 and 7. More specifically, operations in the case in which a positive surge, which particularly often becomes a problem among surges, penetrates from a drain will be described.

Figure 6:
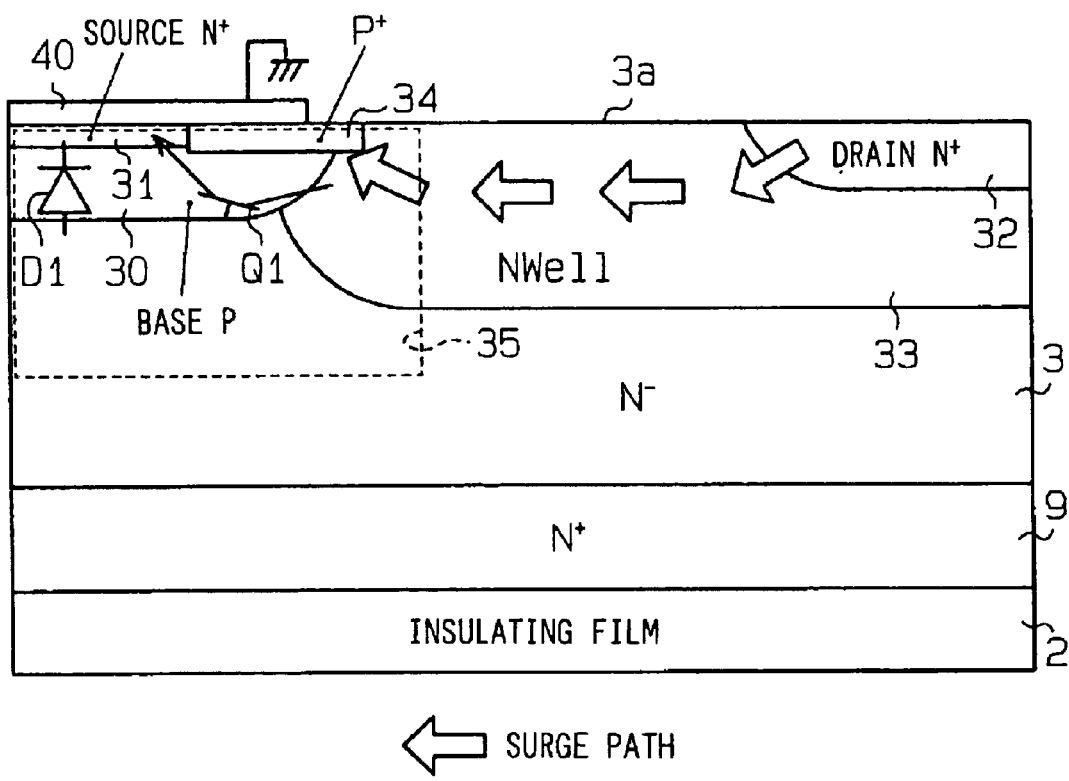
FIG. 6 is a longitudinal sectional view for explaining an action.
Figure 7:
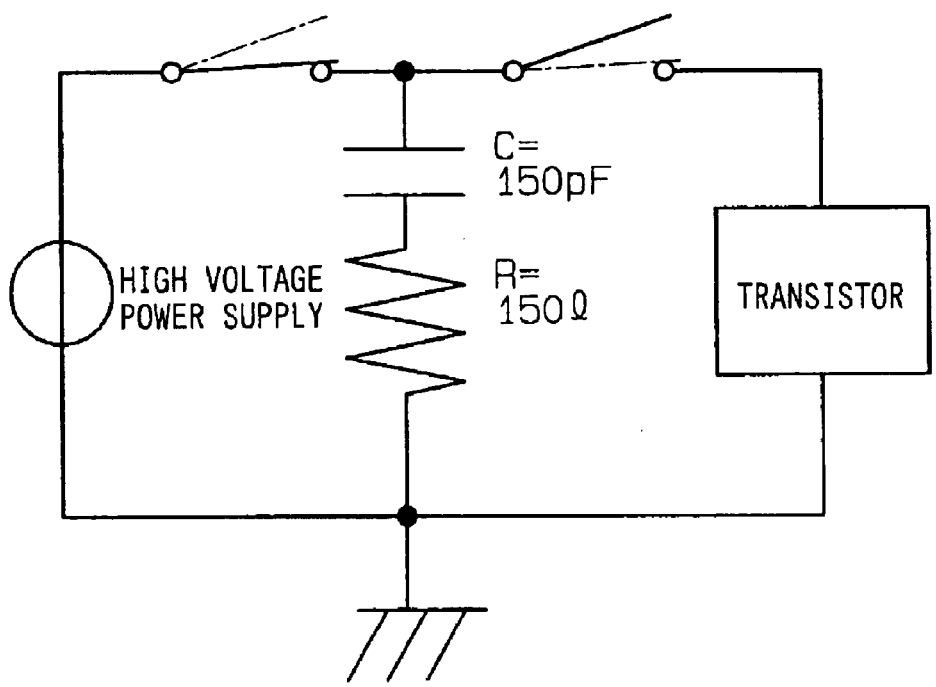
FIG. 7 is a diagram for explaining conditions for a simulation.

In FIG. 6, a surge having penetrated from the drain N⁺ region 32 is absorbed in the ground by the base P region 30 (mainly the base contact P⁺ region 34) through the N well region 33. At this point, since the surge penetrates the semiconductor device through the N well region 33 and also through the base P region 30 (mainly the base contact P⁺ region 34), there is almost no increase in potential of the base P region 30 due to surge penetration (an increase in potential due to a parasitic resistance in the base region 30 is suppressed). Consequently, a parasitic diode D1, which is formed between the base P region 30 and the source N⁺ region 31, operates less easily, and a parasitic NPN bipolar transistor Q1, which is formed of the source N⁺ region 31, the base P region 30, and the N region (mainly the N well region 33), also operates less easily. Therefore, concentration of electric currents on a specific cell due to a parasitic bipolar operation becomes less likely to occur, and a surge current capacity increases.

Figure 38:
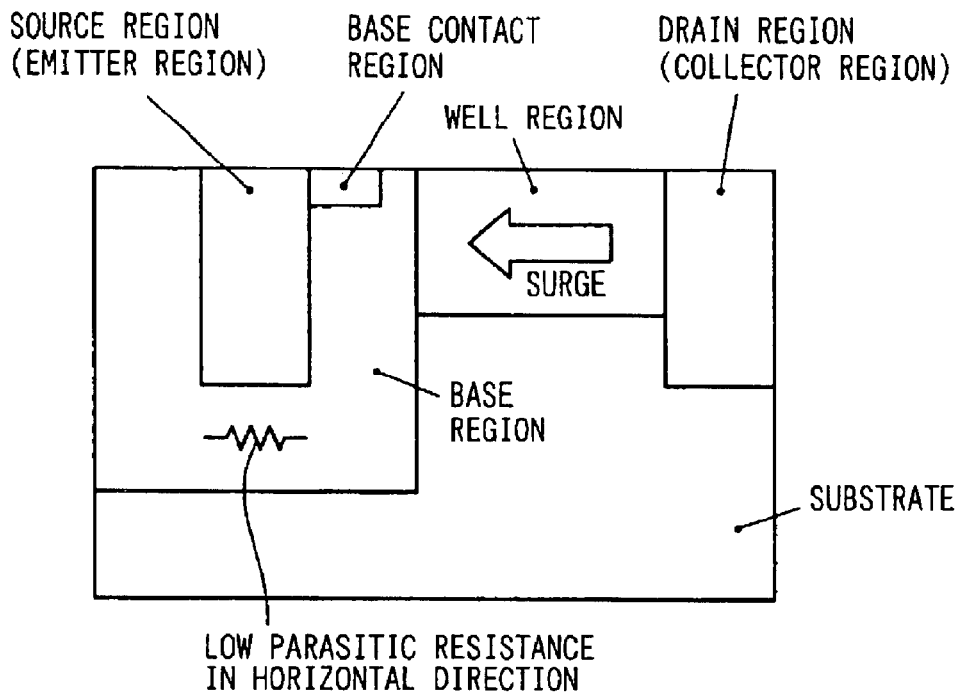
FIG. 38 is a conceptual diagram for explaining an operational principle.
Figure 39:
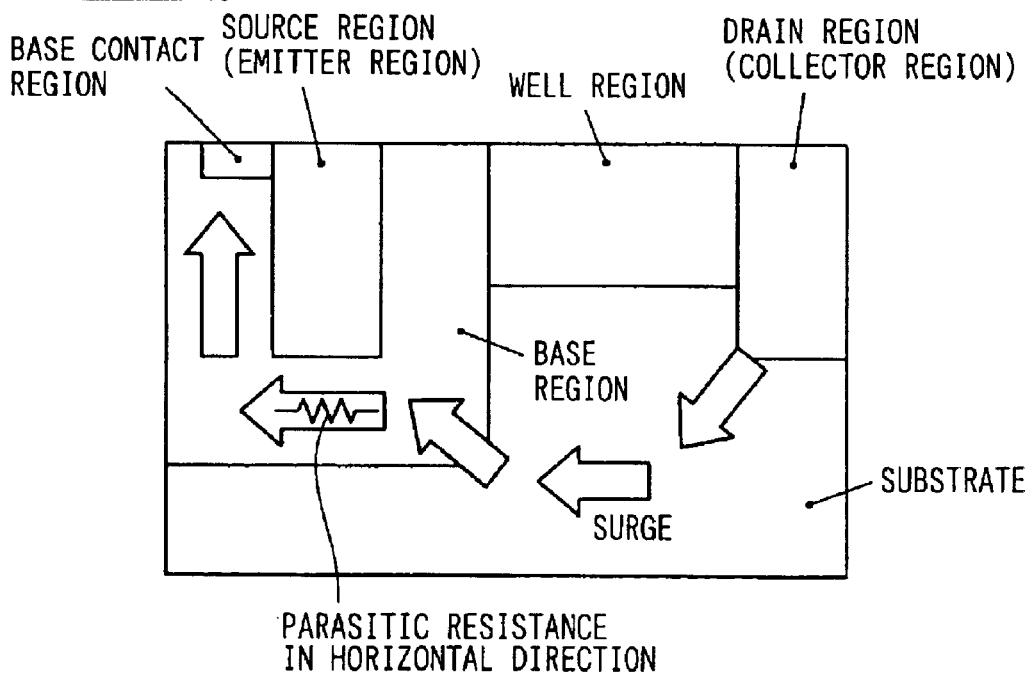
FIG. 39 is a conceptual diagram for comparison.
Figure 40A:
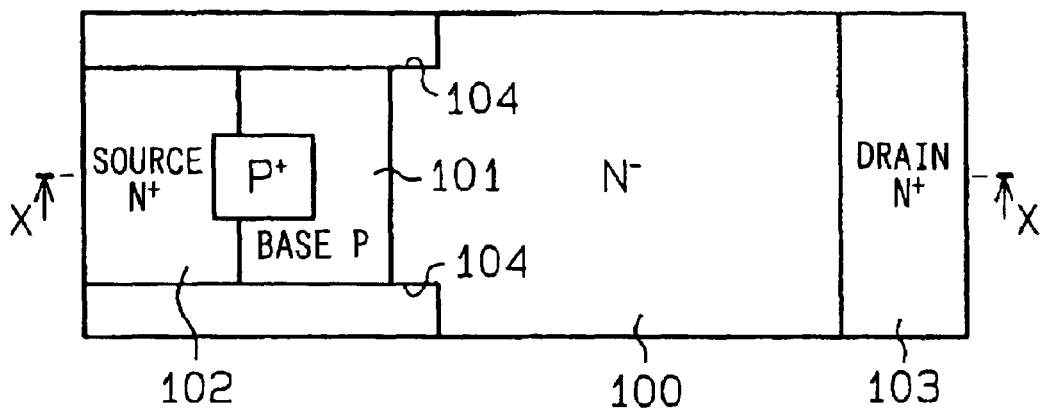
FIGS. 40A–40B are diagrams showing a horizontal power MOS transistor for explaining a background art.
Figure 40B:
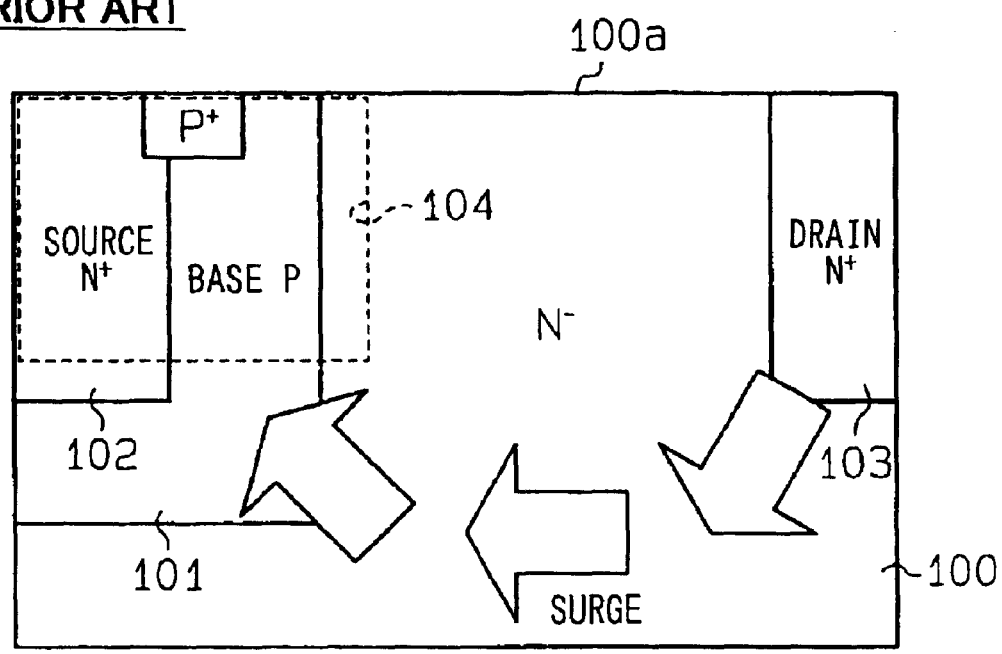

In particular, the base contact P⁺ region 34 is formed between the source N⁺ region 31 and the drain N⁺ region 32 for reducing a parasitic base resistance. Detailed description will be made with reference to FIGS. 38 and 39. FIG. 38 is a diagram corresponding to this embodiment, in which a base contact region is formed on the right in the figure, that is, on a drain region side with respect to a source region. FIG. 39 is a diagram for comparison, in which a base contact region is formed on the left in the figure, that is, on the opposite side of a drain region with respect to a source region. In FIG. 39, a transistor is susceptible to a surge of electrostatic discharge or the like. A mechanism leading to this surge destruction is as follows. When a surge penetrates into the transistor, a potential in the base region increases due to a parasitic resistance (parasitic resistance in a horizontal direction) in the base region. Therefore, a parasitic diode between the base region and the source region operates. As a result, a bipolar transistor with an NPN structure consisting of a substrate, the base region, and the source region is turned ON to cause electric currents to concentrates on a specific cell. On the other hand, in FIG. 38, the base contact region is arranged on a side closer to the drain region viewed from the source region. Thus, a surge can be directly extracted without passing it through the base region, little parasitic resistance exists in the base region, and the parasitic bipolar operation can be eliminated.

As described above, in this embodiment, the horizontal power MOS transistor with a high surge current capacity can be provided. In particular, in the simulation result, endurance of an electrostatic test (see FIG. 7: 150 Ω, 150 pF) was 16.0 kV. More particularly, a high surge current capacity of 15 to 30 kV in an electrostatic test, which is required of a semiconductor device for automobile, can be satisfied. In this way, in this embodiment, required high endurance can be realized without a protective device, an external protective device becomes unnecessary, and significant reduction of cost can be realized. This embodiment has the following characteristics discussed below.

(A) As shown in FIGS. 3 and 4, the trench 35 is formed in the principal surface 3a of the N⁻ silicon layer (semiconductor substrate) 3 to penetrate the base P region 30 in the direction toward the drain N⁺ region 32 from the source N⁺ region 31 as a planar structure thereof. Thus, by adopting the trench gate structure, an electric current path can be extended in the depth direction, and the ON resistance can be reduced. In addition, in the surface layer portion on the principal surface 3a, the well region 33 is formed deeper than the drain N⁺ region 32 and with a higher concentration than the N⁻ silicon layer 3 in the region which includes the drain N⁺ region 32 and is in contact with the base P region 30. Thus, a surge having penetrated from the drain N⁺ region 32 penetrates into the N well region 33 and flows on the surface side of the base P region 30 through the N well region 33 having a low resistance (since the base contact P⁺ region 34 is provided in this embodiment in FIG. 6, mainly flow in this region) to be absorbed in the ground by the source electrode 40. Therefore, since the surge never flows in a vertical direction in the base P region 30, a parasitic resistance of the base P region 30 decreases, and the transistor becomes resistant to the surge.

(B) In at least the surface layer portion on the principal surface 3a in the base P region 30, the P type base contact region having a high concentration (the base contact P⁺ region 34) is formed shallower than the base P region 30 between the source N⁺ region 31 and the drain N⁺ region 32. Consequently, as shown in FIG. 38, there is little parasitic resistance in the horizontal direction in the base region at the time of surge penetration. Thus, an increase in a base potential is small, and the parasitic diode between the base region and the source region operates less easily. As a result, the parasitic bipolar transistor consisting of the substrate, the base region, and the source region performs the ON operation less easily, and concentration of electric currents can be prevented.

(C) A concentration increases continuously from the bottom to the surface in the N well region 33. Thus, a surge is flown to the surface of the N well region 33, whereby it becomes easy to flow the surge to the surface of the base P region 30, and a path of the surge in the base P region 30 is shortened. Consequently, a parasitic base resistance can be reduced to suppress an increase in a potential of the base P region 30, and a surge current capacity can be improved.

(D) The base contact region (base contact P⁺ region 34) is formed apart from the trench 35, and the gate electrode 39 is formed on the principal surface 3a via the gate oxide film (gate insulating film) 38. Thus, a region operating as a channel on the principal surface 3a of the substrate can be formed to reduce an ON resistance.

(E) In the bottom of the N⁻ silicon layer (semiconductor substrate) 3, the transistor has the N⁺ type embedded layer (embedded N⁺ layer 9) having a concentration higher than that of the N⁻ silicon layer 3, and the bottom corner portion of the trench 35 is made deeper than the N well region 33 and shallower than the embedded N⁺ layer 9. Thus, the vicinity of the bottom corner portion of the trench 35 where electric fields tend to concentrate is turned into a region with a low impurity concentration, whereby the concentration of electric fields can be prevented, and a withstand voltage can be improved.

Figure 8A:
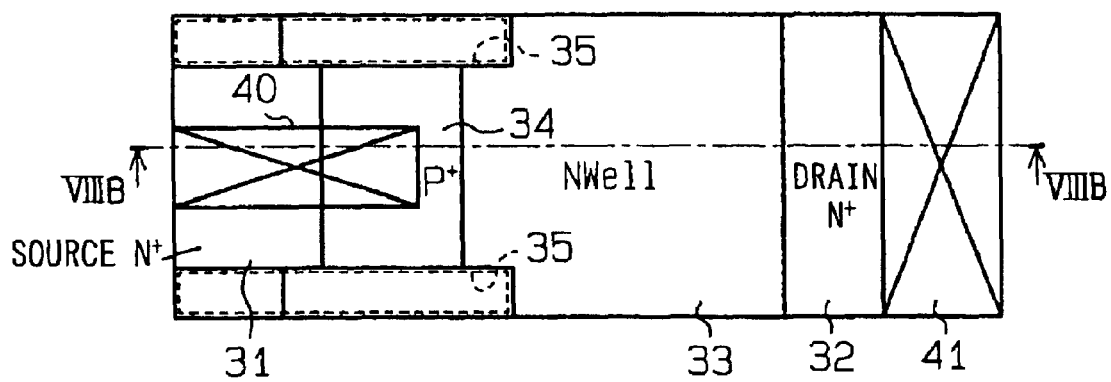
FIGS. 8A–8B are illustrations of a horizontal power MOS transistor.
Figure 8B:
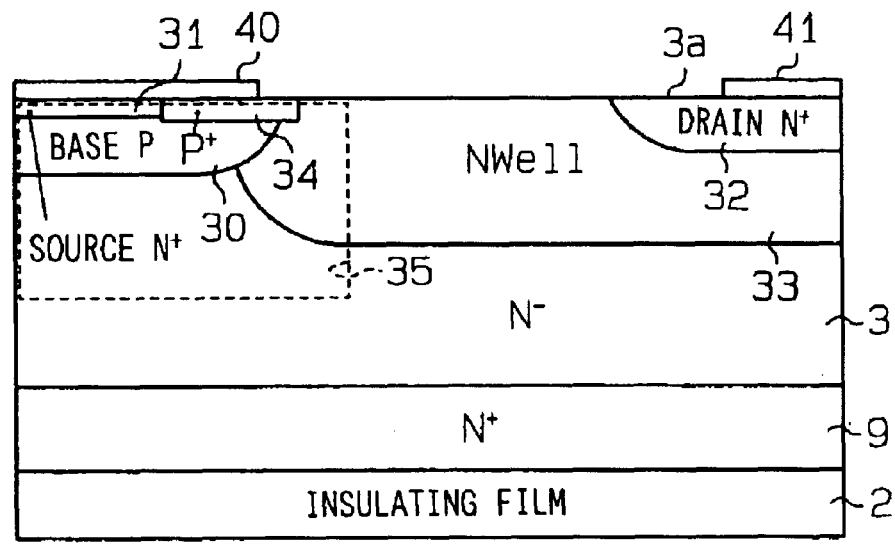
Figure 9A:
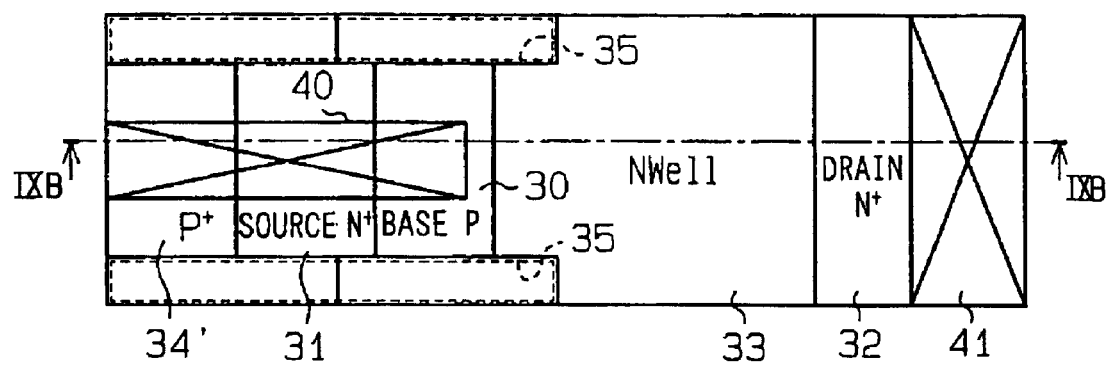
FIGS. 9A–9B are illustrations of another horizontal power MOS transistor for comparison.
Figure 9B:
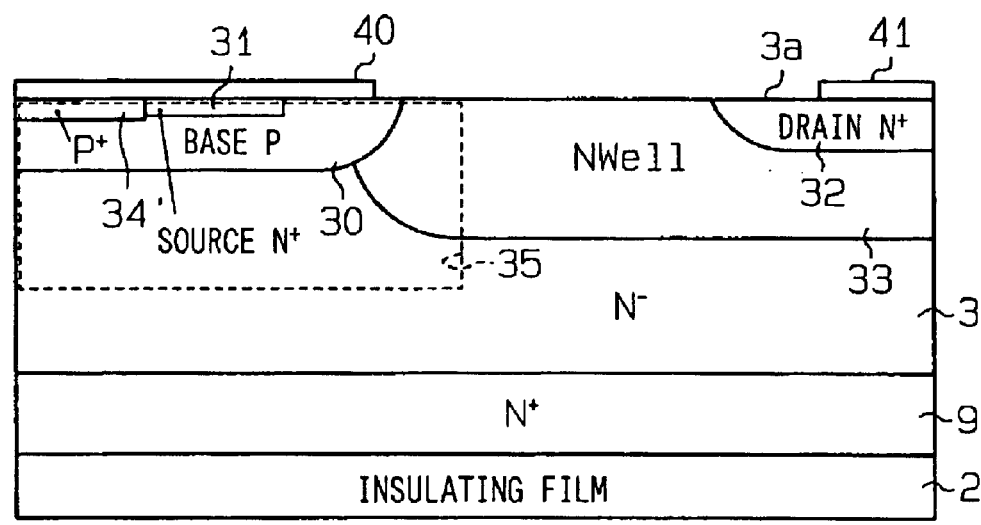

In FIG. 2, the base contact P⁺ region 34 is formed apart from the trench 35 by the distance d1. However, as shown in FIG. 8A, the base contact P⁺ region 34 may be formed to contact the trench 35. In FIGS. 8A–8B, a channel is not formed on the substrate surface. Next, FIGS. 8A–8B will be compared with FIGS. 9A–9B. In FIGS. 9A–9B, a base contact $P^+$ region 34' is formed on the left in the figure, that is, on the opposite side of the drain $N^+$ region 32 with respect to the source $N^+$ region 31. Here, in FIGS. 8A–8B, an ON resistance per one cell is much higher from nonexistence of a surface gate (planer gate). However, in FIG. 8A, since the portion where the base contact $P^+$ region 34' exists in FIG. 9B is deleted, an area of one cell is reduced. Therefore, in FIGS. 8A–8B, regardless of the deletion of the surface gate, it becomes possible to have the same degree of ON resistance per a unit area as that in FIGS. 9A–9B.

In this way, by adopting the structure of FIGS. 8A–8B, the horizontal power MOS transistor with a high surge current capacity can be provided while the ON resistance per a unit area is maintained.

Figure 10:
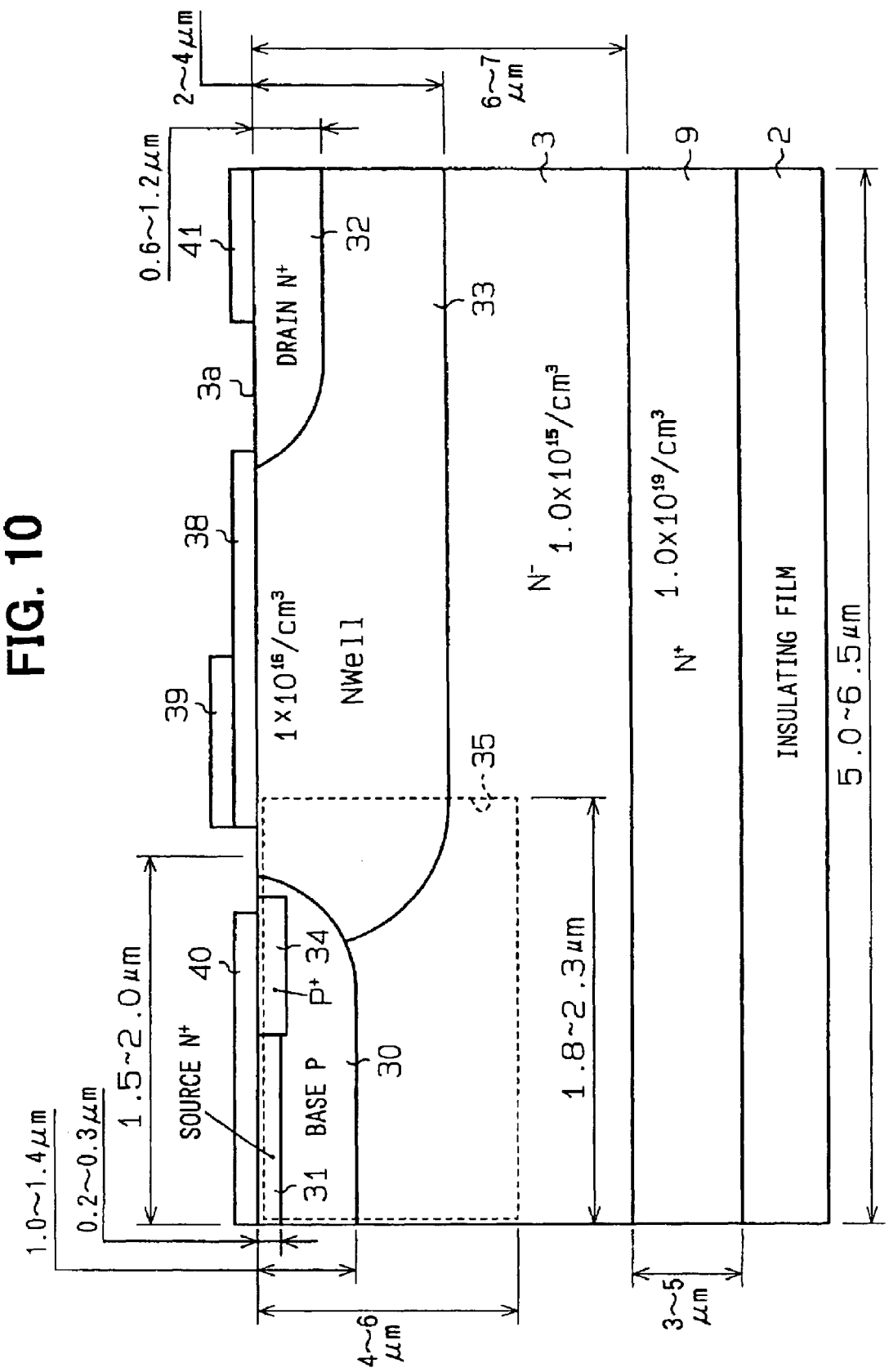
FIG. 10 is a longitudinal sectional view showing a horizontal power MOS transistor.

In addition, in FIG. 3, the base contact $P^+$ region 34 is formed so as to reach the inside of the N well region 33 from the base P region 30. However, the base contact $P^+$ region 34 may be formed only in the base P region 30 as shown in FIG. 10.

(Second Embodiment)

Next, a second embodiment will be described focusing on differences from the first embodiment.

Figure 11A:
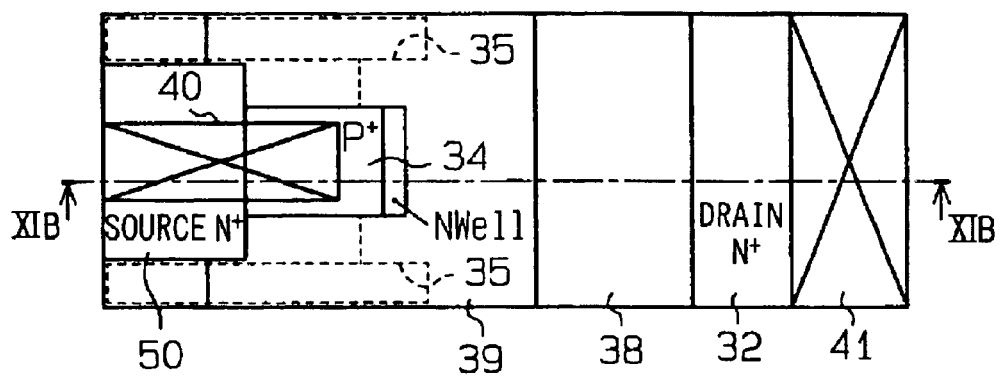
FIGS. 11A–11B are illustrations of a horizontal power MOS transistor according to a second embodiment.
Figure 11B:
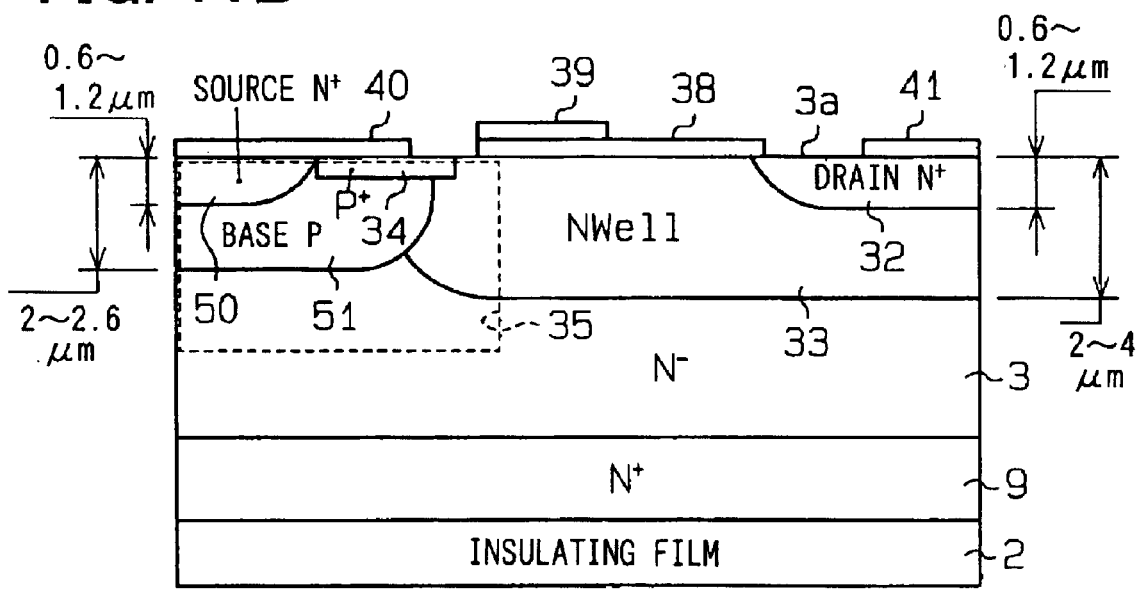

FIGS. 11A–11B shows a horizontal power MOS transistor in this embodiment. A plan view of the transistor is shown in FIG. 11A and a longitudinal sectional view of the transistor is shown in FIG. 11B.

As compared with the first embodiment, in this embodiment, a source $N^+$ region 50 also shares a mask with the emitter contact $N^+$ region 23 of the bipolar transistor portion (see FIG. 1), and is formed as deep as 0.6 to 1.2 μm. Consequently, while the depth of the source $N^+$ region 31 of FIG. 3 is 0.2 to 0.3 μm, in FIG. 11B, a depth of the source $N^+$ region 50 is set to 0.6 to 1.2 μm. In addition, the base P region 51 is also formed as deep as 2 to 2.6 μm as the source $N^+$ region 50 is formed deep.

With such a structure, an electric current can be flown to the deeper portion of the trench 35 than in the first embodiment.

(Third Embodiment)

Next, a third embodiment will be described by emphasizing differences with the first embodiment.

Figure 12A:
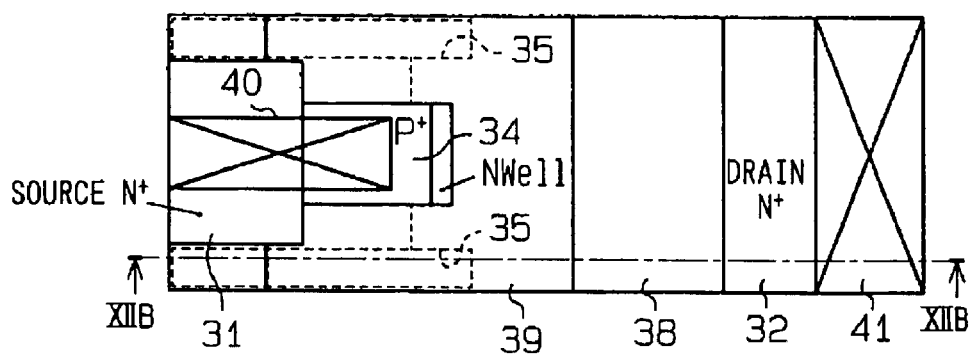
FIGS. 12A–12B are longitudinal sectional views for explaining a third embodiment.
Figure 12B:
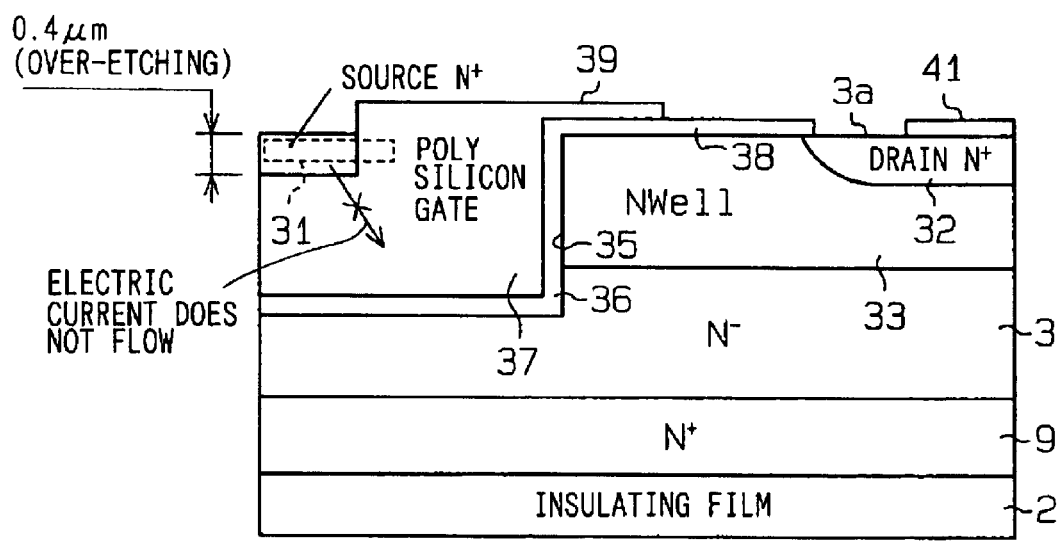
Figure 13:
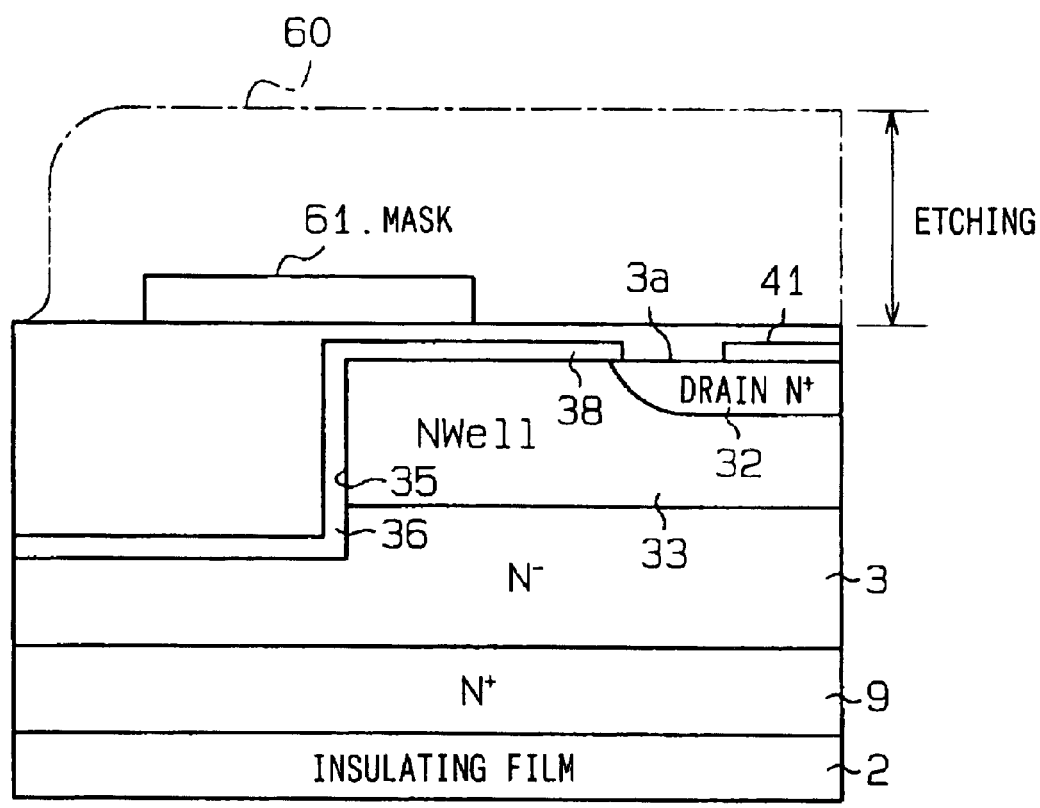
FIG. 13 is a longitudinal sectional view showing a manufacturing process.

In the case of the first embodiment shown in FIG. 4, as shown in FIGS. 12A–12B, the polysilicon gate electrode 39 on the substrate surface tends to be over-etched. More particularly, the polysilicon gate electrode 37 inside the trench 35 is over-etched by about 0.4 μm from a surface thereof, and an electronic current may not flow in a place where there is no gate electrode. More specifically, as shown in FIG. 13, a polysilicon film 60 is formed so as to fill polysilicon in the trench 35, a surface of the polysilicon film 60 is planarized by etching, and the polysilicon film 60 is etched with a mask 61 arranged thereon. Then, as shown in FIG. 12, over-etching of about 0.4 μm occurs.

Thus, this embodiment copes with the problem as described below.

Figure 14A:
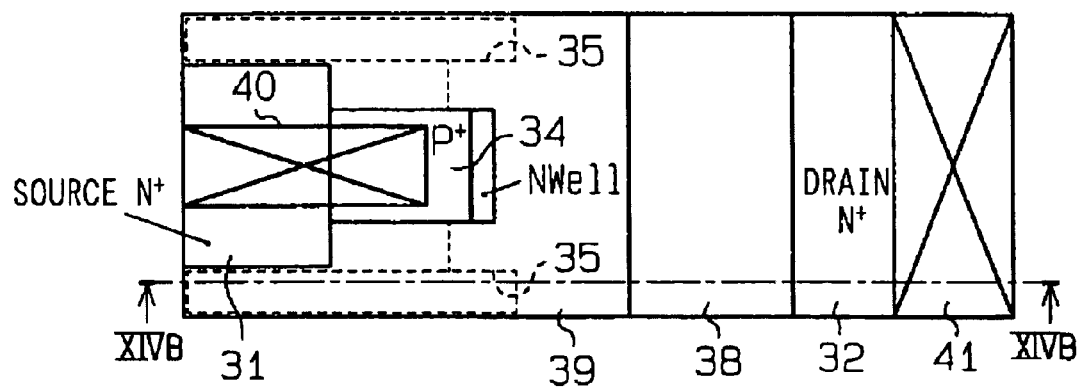
FIGS. 14A–14B are illustrations of a horizontal power MOS transistor according to a third embodiment.
Figure 14B:
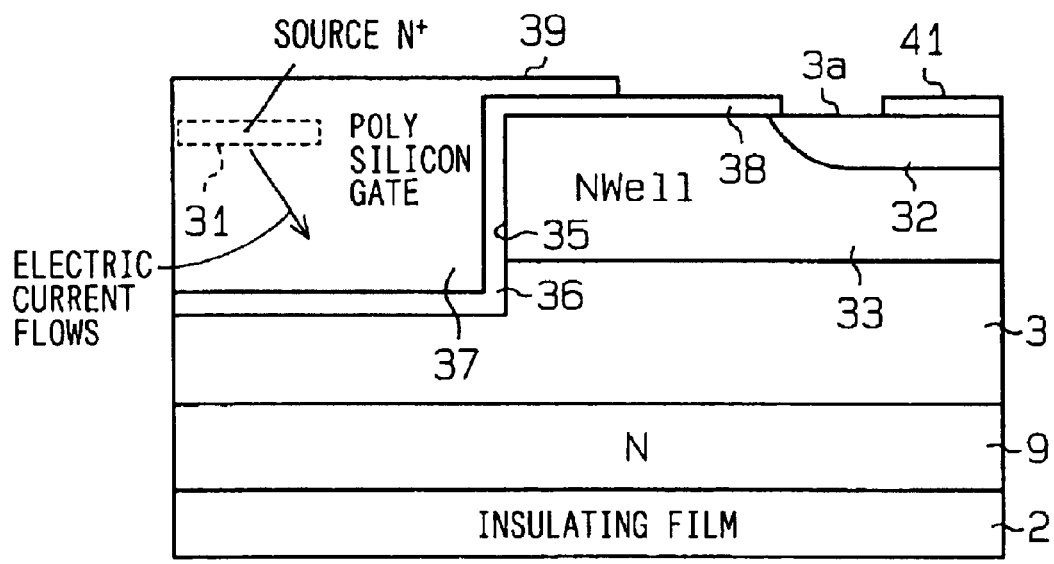

FIGS. 14A–14B show a horizontal power MOS transistor in this embodiment. A plan view of the transistor is shown in the upper part of FIG. 14A, and a longitudinal sectional view of the transistor is shown in the lower part of FIG. 14B.

In FIGS. 14A–14B, the polysilicon gate electrode 39 on the substrate surface is arranged to be extended to an upper position on the side of the source $N^+$ region 31. More particularly, the polysilicon gate electrode 37 is also arranged in the opening of the source $N^+$ region 31 on the side of the trench 35. Consequently, an area through which an electric current flows can be increased, and the transistor becomes preferable for practical use.

(Fourth Embodiment)

Next, a fourth embodiment will be described by emphasizing differences with the first embodiment.

Figure 15:
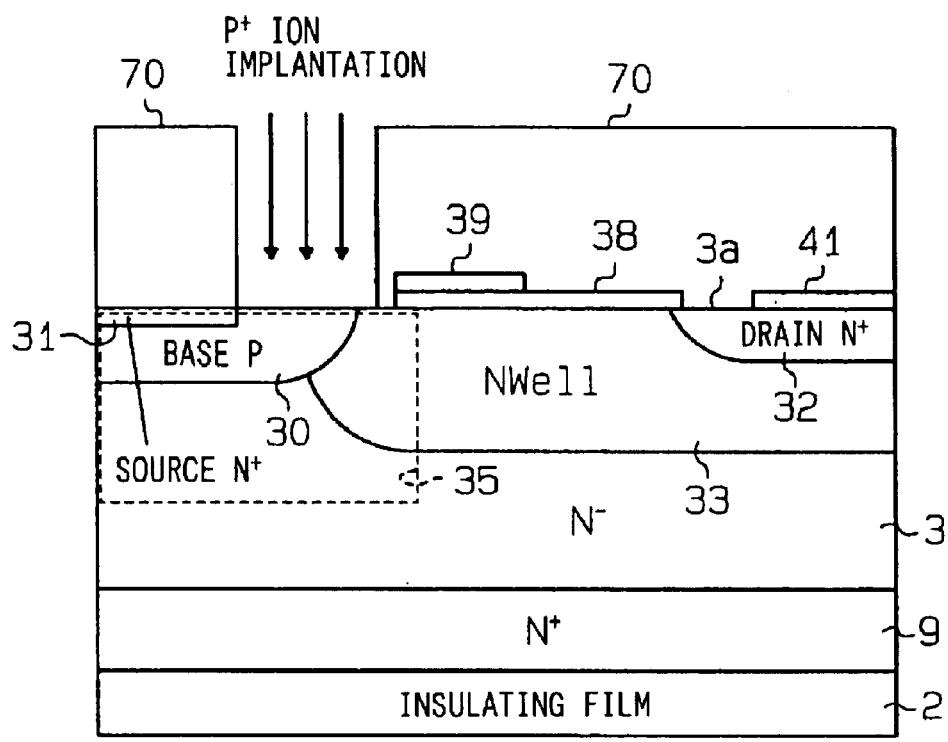
FIG. 15 is a longitudinal sectional view for explaining a fourth embodiment.
Figure 16:
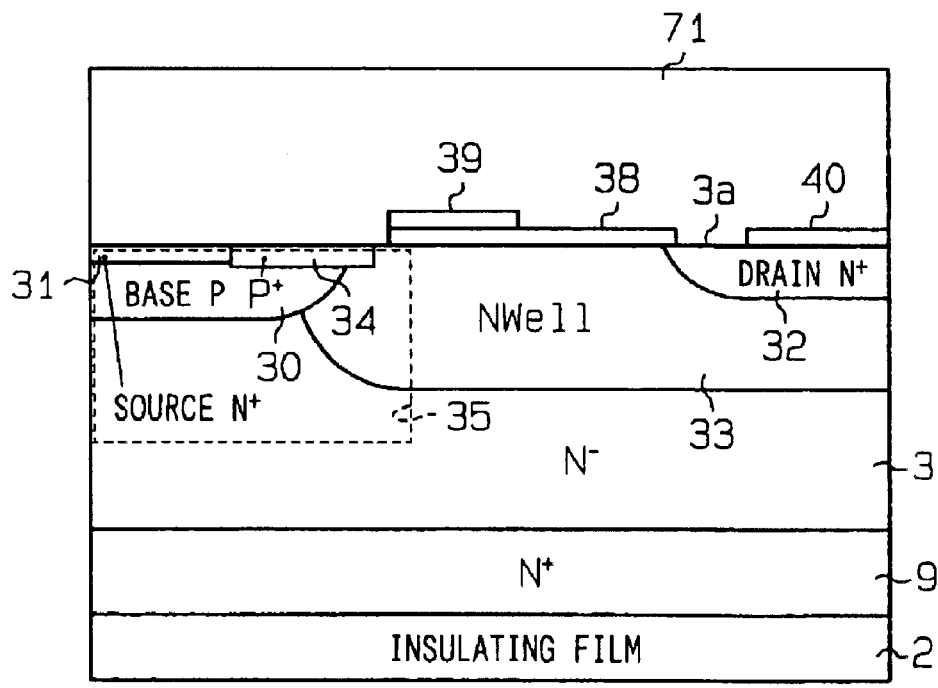
FIG. 16 is a longitudinal sectional view showing a manufacturing process.
Figure 17:
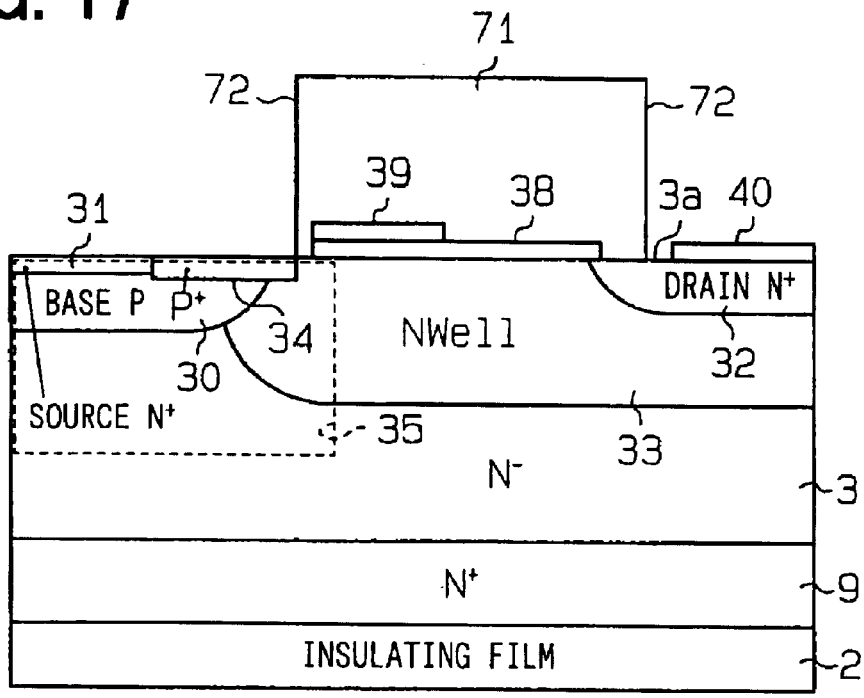
FIG. 17 is a longitudinal sectional view showing a manufacturing process.

In the case in which the MOS transistor shown in FIGS. 2 to 5 is manufactured, formation of the base contact $P^+$ region 34 is usually performed as follows. First, as shown in FIG. 15, $P^+$ ions are implanted in a predetermined region using a mask 70 (boron or $BF_2$ is used as an impurity). Then, as shown in FIG. 16, annealing is performed. Moreover, an oxide film 71 is deposited on a device surface (upper surface), and as shown in FIG. 17, a contact hole 72 is formed in the oxide film 71. In this series of steps, since boron or $BF_2$, which is implanted as an impurity in order to form the $P^+$ region, has a large diffusion coefficient, it easily reaches the trench 35 to cause an increase in a threshold voltage Vt.

Therefore, this embodiment copes with the problem as described below.

Figure 18:
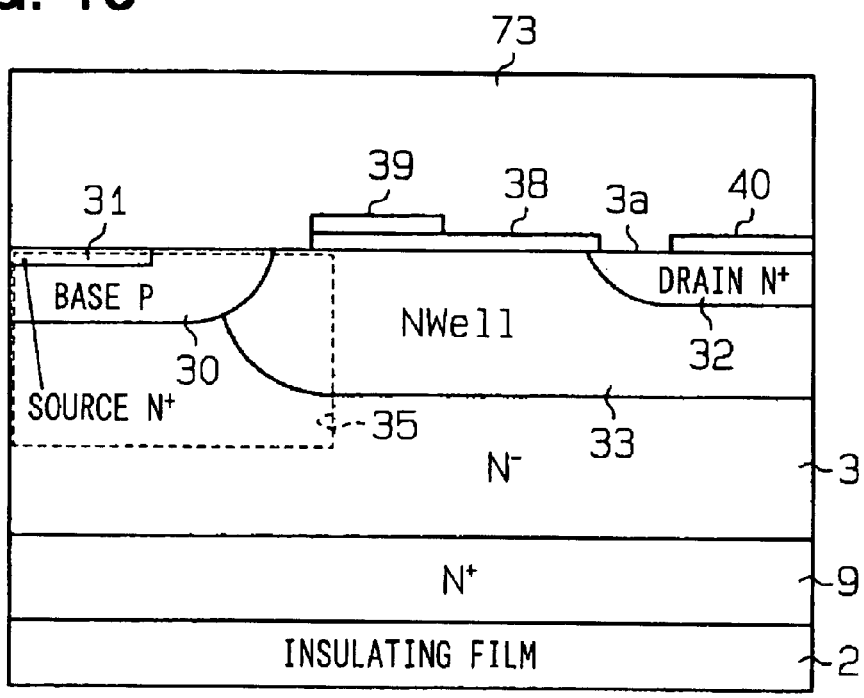
FIG. 18 is a longitudinal sectional view showing a manufacturing process.
Figure 19:
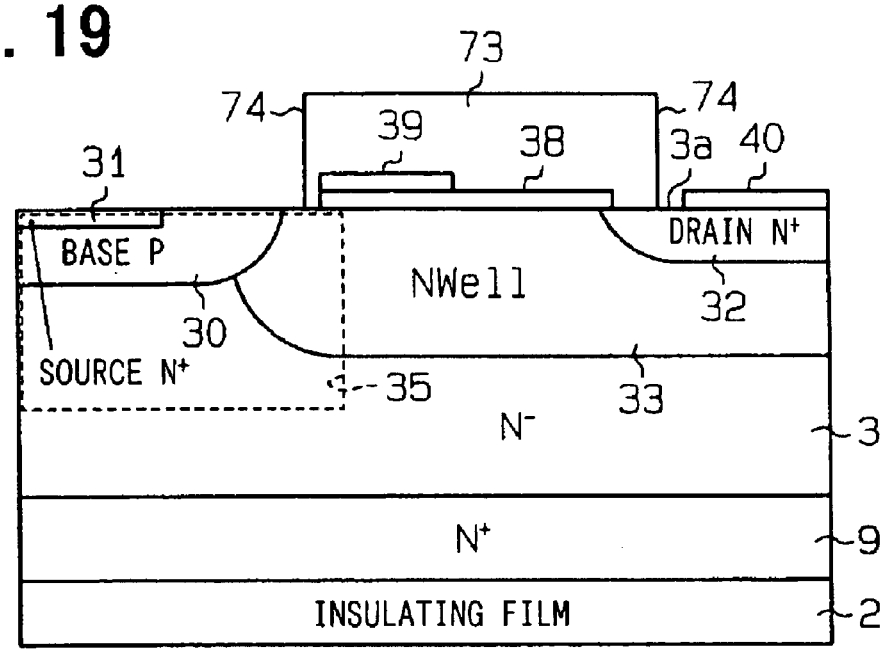
FIG. 19 is a longitudinal sectional view showing a manufacturing process.
Figure 20:
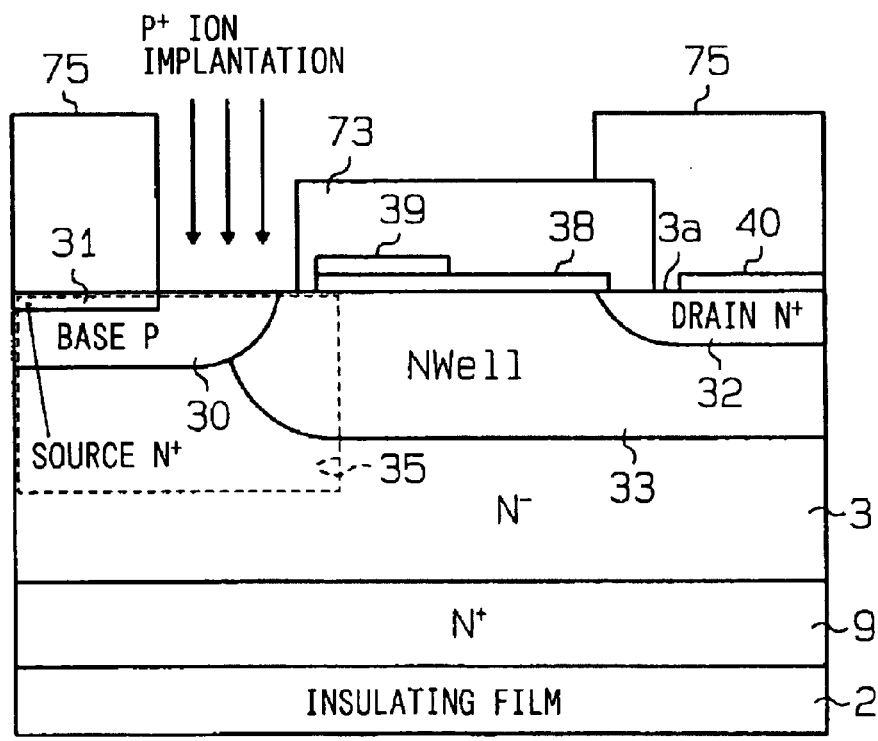
FIG. 20 is a longitudinal sectional view showing a manufacturing process.
Figure 21:
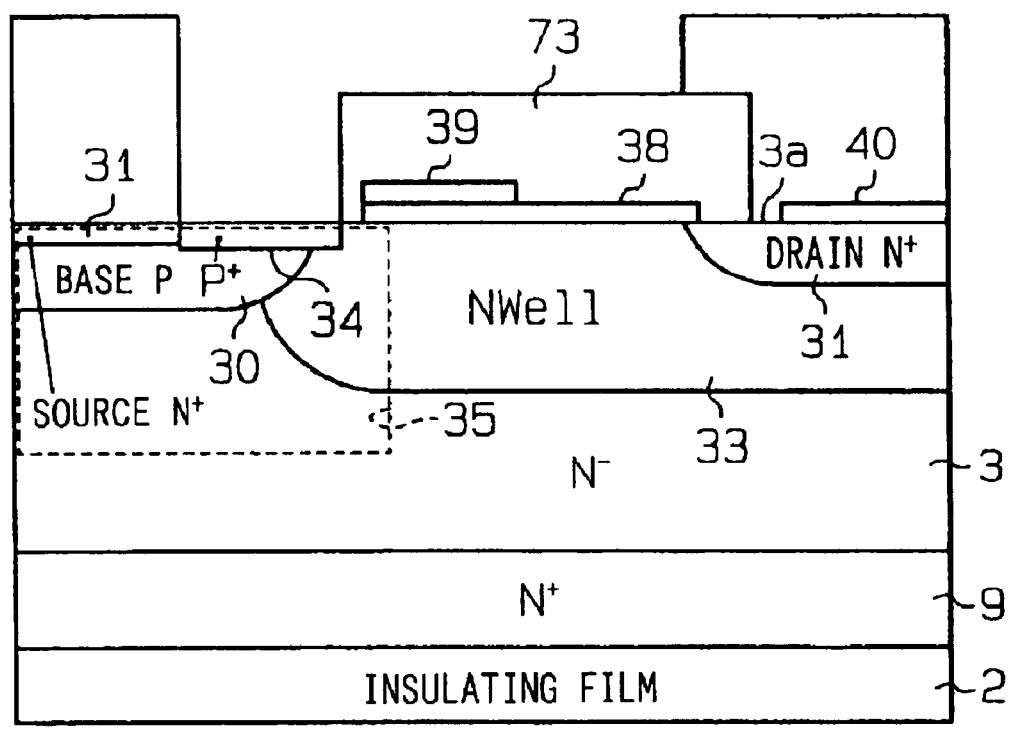
FIG. 21 is a longitudinal sectional view showing a manufacturing process.

First, as shown in FIG. 18, after performing annealing of the $N^+$ regions 31 and 32 after ion implantation, an oxide film 73 is deposited on a device surface (upper surface). Moreover, as shown in FIG. 19, a contact hole 74 is formed in the oxide film 73. Then, as shown in FIG. 20, $P^+$ ions are implanted in a predetermined region using a mask 75 (boron or $BF_2$ is used as an impurity). Moreover, annealing is performed as shown in FIG. 21.

According to this process, diffusion of $P^+$ can be suppressed.

As described above, in this embodiment, a method of manufacturing a semiconductor device, in which the base contact $P^+$ region 34 is formed apart from the trench 35 as shown in FIG. 2, includes the following steps. First, as shown in FIG. 19, after forming the base P region 30, the source $N^+$ region 31, the drain $N^+$ region 32, the N well region 33, and the trench 35, the silicon oxide film (insulating film) 73, in which a region where a base contact is planned to be formed is opened as a contact hole, is arranged on the principal surface 3a. Second, as shown in FIGS. 20 and 21, ion implantation is performed using the silicon oxide film (insulating film) 73 as a mask to form the base contact $P^+$ region 34 apart from the trench 35 in the surface layer portion on the principal surface 3a. Thus, the impurity for forming a base contact region is prevented from diffusing to reach the trench 35.

(Fifth Embodiment)

Next, a fifth embodiment will be described by emphasizing differences with the first embodiment.

Figure 22A:
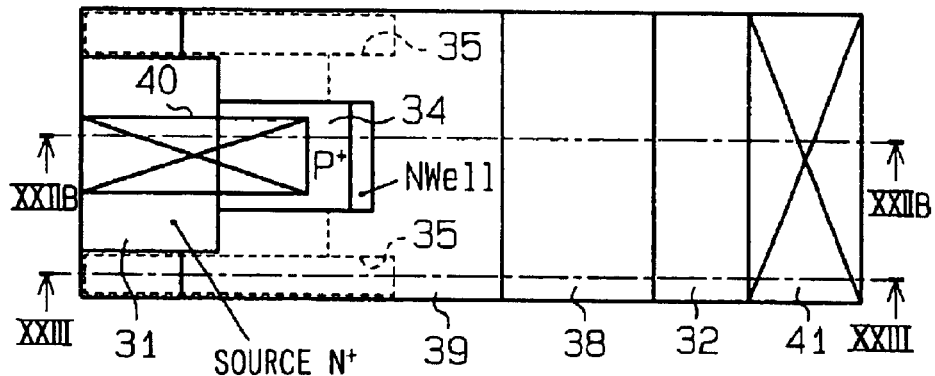
FIGS. 22A–22B are illustrations of a horizontal power MOS transistor according to a fifth embodiment.
Figure 22B:
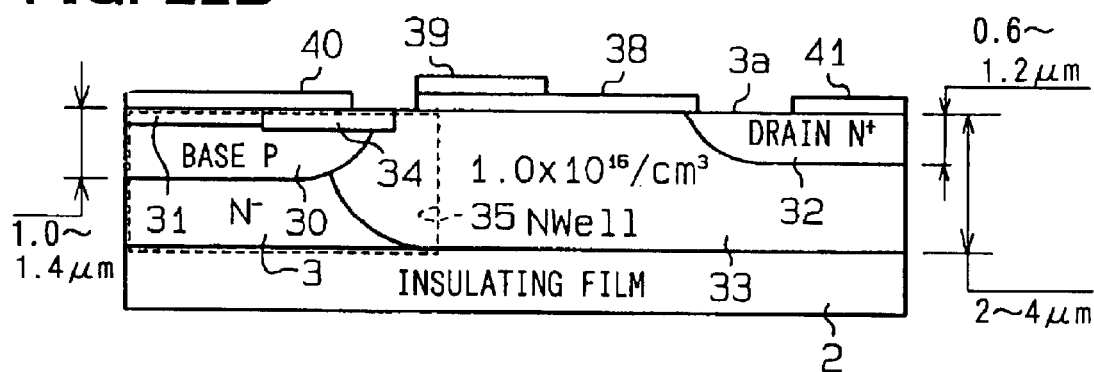
Figure 23:
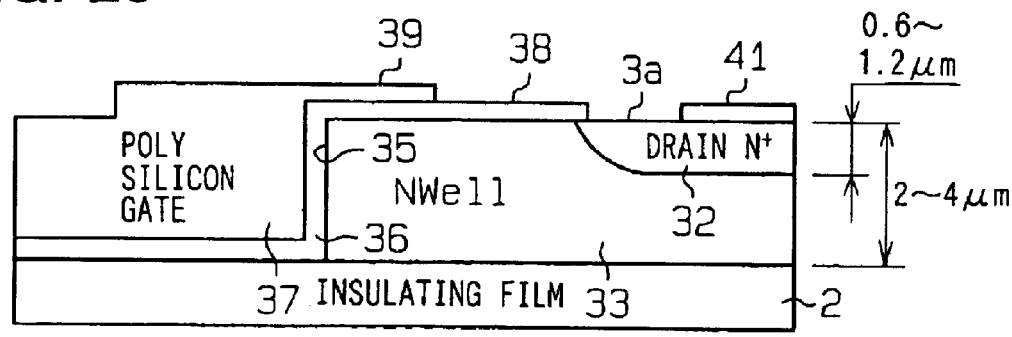
FIG. 23 is a longitudinal sectional view of the transistor along line XXIII—XXIII of FIG. 22A.

FIGS. 22A–22B show a horizontal power MOS transistor in this embodiment. A plan view of the transistor is shown in FIG. 22A, and a longitudinal sectional view along line XXII—XXII of the transistor is shown in FIG. 22B. FIG. 23 shows a longitudinal sectional view of the transistor along line XXIII—XXIII in FIG. 22.

The embedded $N^+$ layer 8 among the embedded $N^+$ layers 7, 8, and 9 in FIG. 1 is used in a bipolar transistor, whereas the embedded $N^+$ layer 9 in FIG. 3 may not be provided. In this case, since there is no potential difference between the gate electrode in the trench 35 and the embedded insulating film 2, a withstand voltage does not fall even if the trench 35 is formed to be deep. Therefore, in this embodiment shown in FIGS. 22A–22B and 23, the trench 35 is formed to be in contact with the embedded insulating film 2. In this structure, since the trench for device separation 4 (see FIG. 1) and the trench 35 for MOS gate have the same depth, both the trenches can be created in an identical process. More particularly, by using the SOI substrate and adapting the trench 35 to reach the embedded insulating film 2 of the SOI substrate, the trench for device separation 4 and the trench for MOS gate 35 can be created simultaneously. Therefore, a reduction in process cost can be achieved.

In addition, in this case, the thickness of the silicon film on the insulating film 2 only has to sufficient for allowing the depth of the N well region 33 to be secured. Thus, the thickness can be as small as 2 to 4 μm. Further, because the trench for device separation 4 (see FIG. 1) can be created by etching silicon by 2 to 4 μm, cost for etching can be reduced. More particularly, by using the SOI substrate and setting the thickness of the N⁻ silicon layer (semiconductor layer) 3 on the embedded insulating film 2 in the SOI substrate to the depth of the N well region 33 to reduce the film thickness of the N⁻ silicon layer 3 as much as possible, the depth of the trench for device separation 4 can be reduced, and cost for etching in creating the trench 4 with etching can be reduced.

(Sixth Embodiment)

Next, a sixth embodiment will be described by emphasizing differences with the first embodiment.

Figure 24:
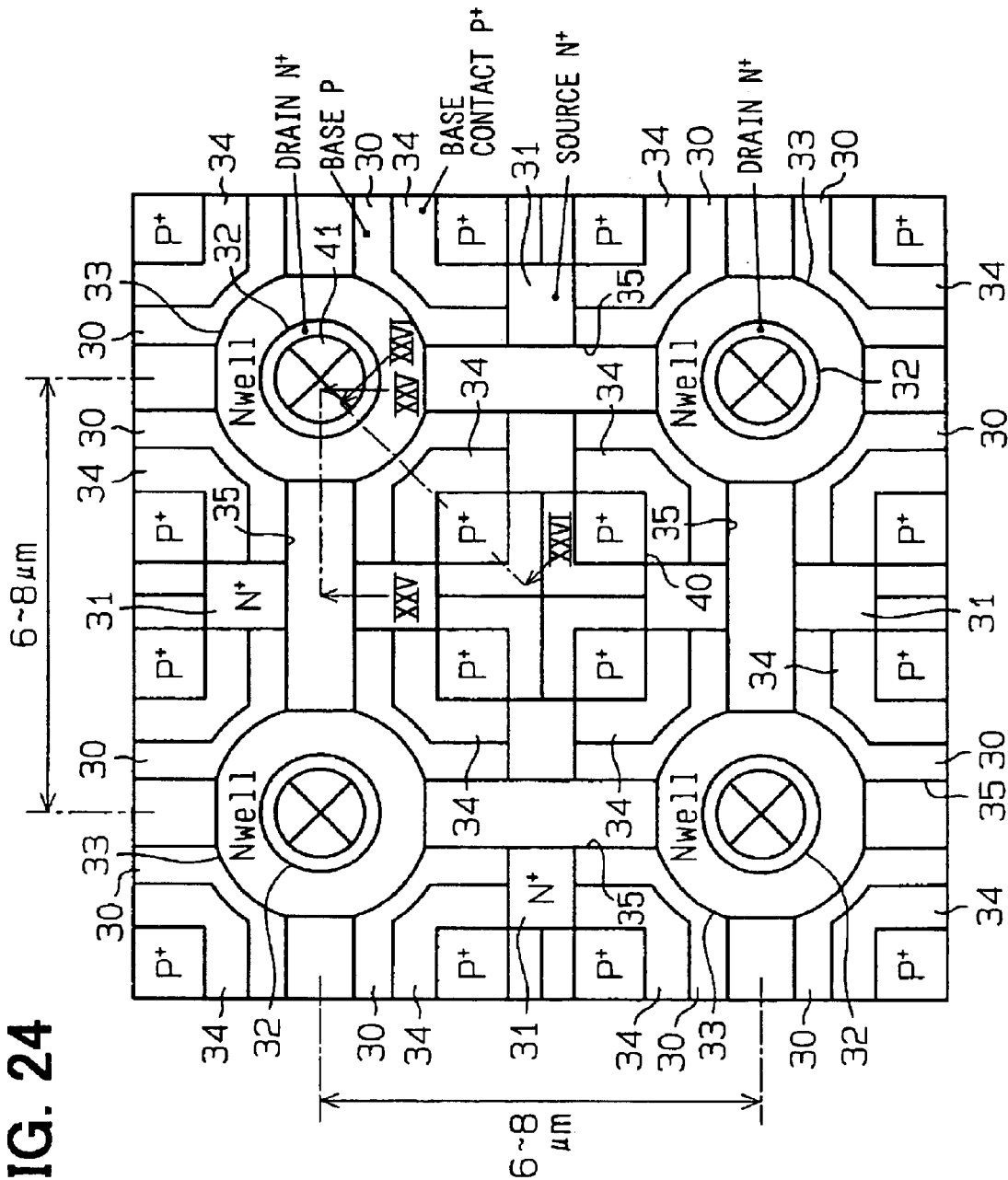
FIG. 24 is a plan view of a horizontal power MOS transistor according to a sixth embodiment.
Figure 25:
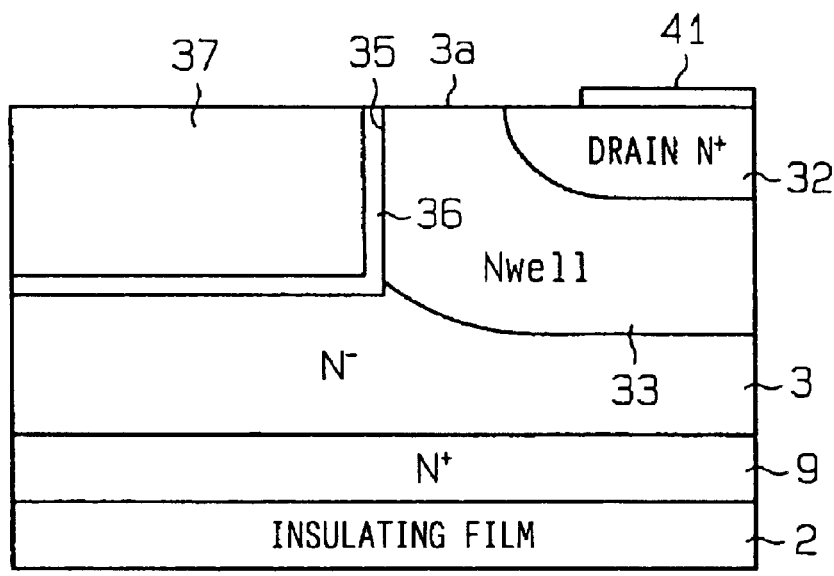
FIG. 25 is a longitudinal sectional view of the transistor along line XXV—XXV of FIG. 24.
Figure 26:
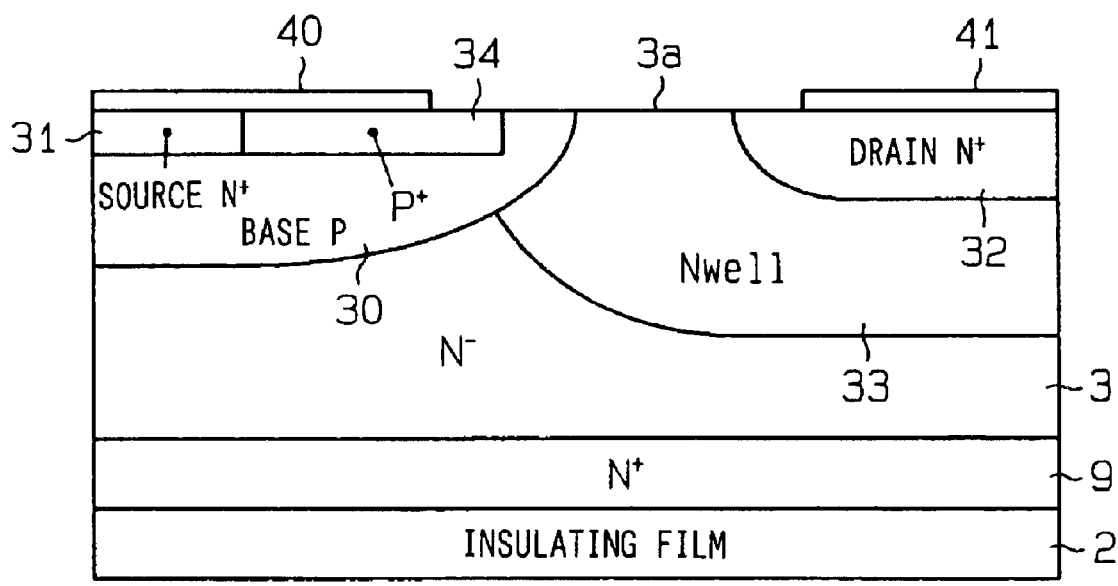
FIG. 26 is a longitudinal sectional view of the transistor along line XXVI—XXVI of FIG. 24.

FIG. 24 shows a plan view of a horizontal power MOS transistor in this embodiment. FIG. 25 shows a longitudinal sectional view of the transistor along line XXV—XXV of FIG. 24. FIG. 26 shows a longitudinal sectional view of the transistor along line XXVI—XXVI.

In the plan view of FIG. 24, the N well regions 33 are arranged in a lattice shape (formed lengthwise and crosswise), and the drain N⁺ regions 32 are formed inside the respective N well regions 33. The N well regions 33 are surrounded by the base P regions 30. In this way, the drain N⁺ regions 32 and the N well regions 33 form an island shape, and the base P regions 30 exist around them (the drain N⁺ regions 32 and the N well regions 33 are surrounded by the base P regions 30). The source N⁺ regions 31 are formed in the surface layer portions in the base P regions 30 so as to surround the N well regions 33. More particularly, the drain N⁺ regions 32 are laid out so as to surround the source N⁺ regions 31. In addition, in the surface layer portions in the base P regions 30, the base contact P⁺ regions 34 are formed around the N well regions 33. Moreover, the trenches 35 are formed so as to be in contact with both the N well regions 33 adjacent to each other.

In this layout, since the drain N⁺ regions 32 and the N well regions 33 are surrounded by the base P regions 30, an electric current path can be widened. Consequently, a surge current capacity can be improved at the time of surge penetration. In addition, in this layout, wider base contact P⁺ regions 34 can be achieved. Therefore, concentration of electric currents on the base contact P⁺ regions 34 can be prevented at the time of surge penetration to improve a surge current capacity.

In addition, in this embodiment, as shown in FIG. 24, an interval between drains is 6 to 8 μm and a cell size is 6 to 8 μm. Thus, an area of one cell is 36 to 64 μm². In comparison of the first embodiment (FIGS. 2 and 3) and this embodiment (FIG. 24), in FIG. 3, an interval between a source and a drain is 5.0 to 6.5 μm and an interval between drains is 10 to 13 μm, and in FIG. 2, an interval between trench gates is 3.6 to 5 μm. Thus, an area of one cell is 36 to 65 μm². As a result, since the area does not increase even if the layout of the first embodiment (FIGS. 2 and 3) is changed to the layout of this embodiment, a surge current capacity can be improved without increasing an ON resistance. However, since the device of this embodiment has a smaller interval between drains than the first embodiment, a withstand voltage is about 20 volts.

(Seventh Embodiment)

Next, a seventh embodiment will be described by emphasizing differences with the first embodiment.

Figure 27:
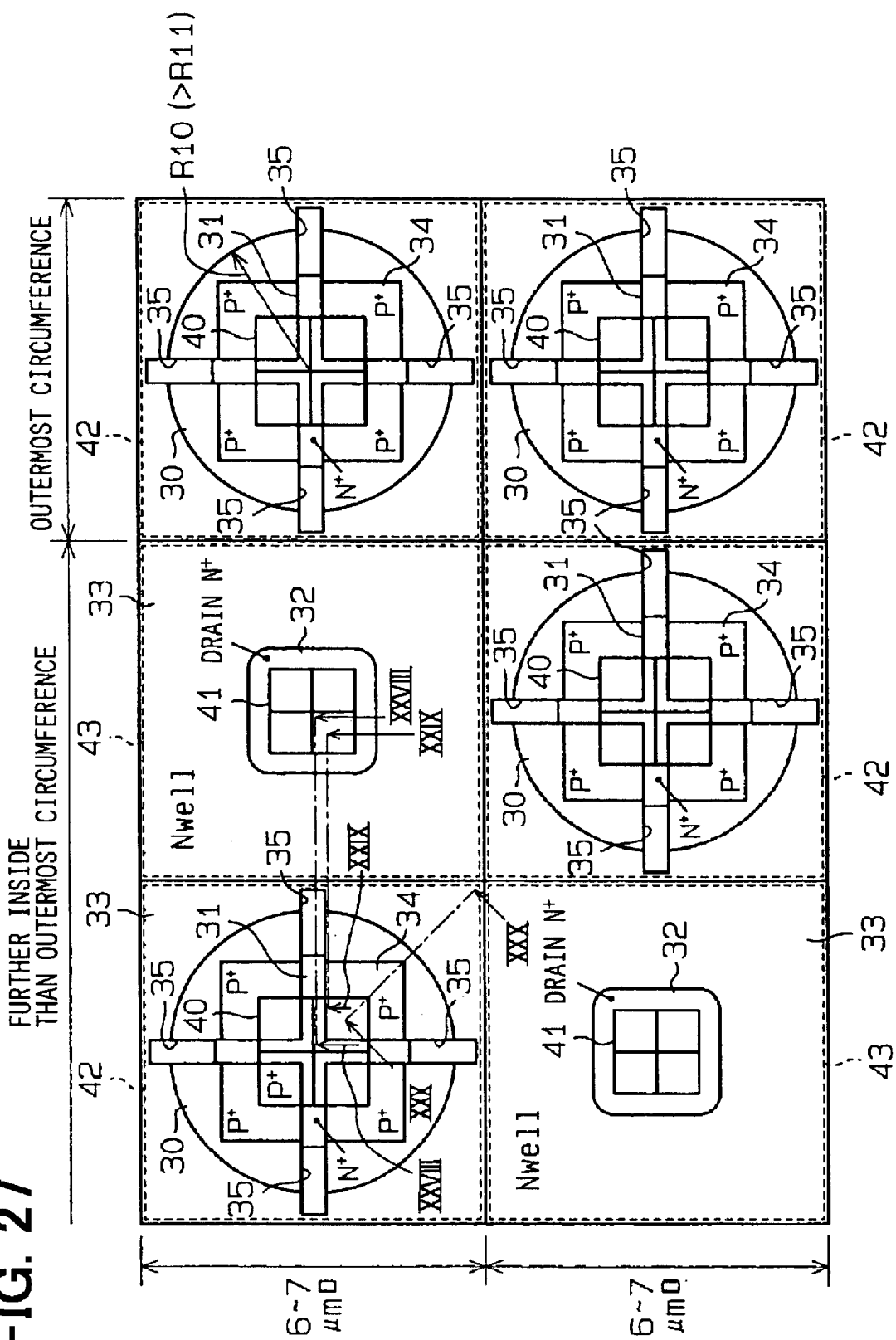
FIG. 27 is a plan view of a horizontal power MOS transistor in a seventh embodiment.
Figure 28:
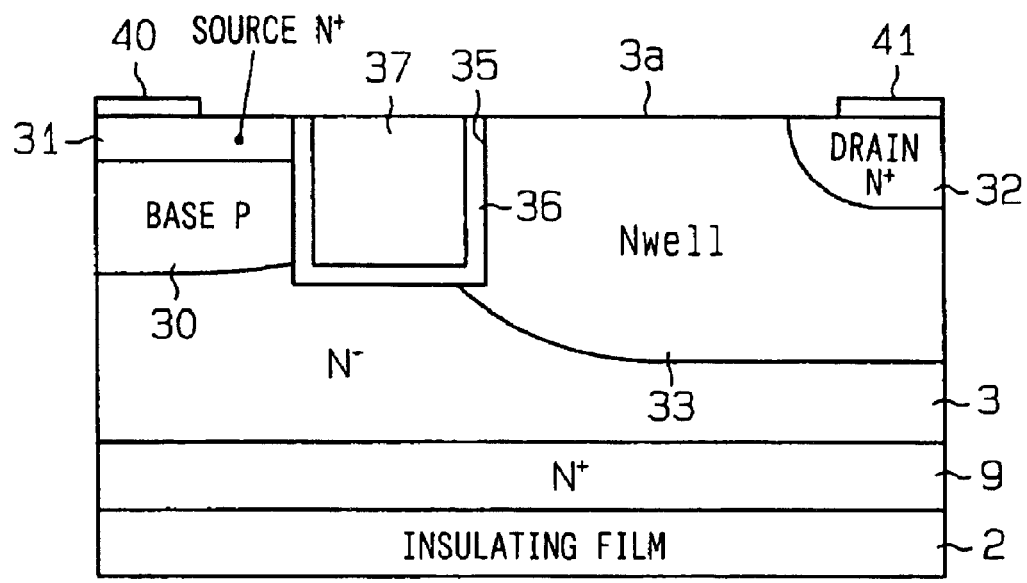
FIG. 28 is a longitudinal sectional view of the transistor along line XXVIII—XXVIII of FIG. 27.
Figure 29:
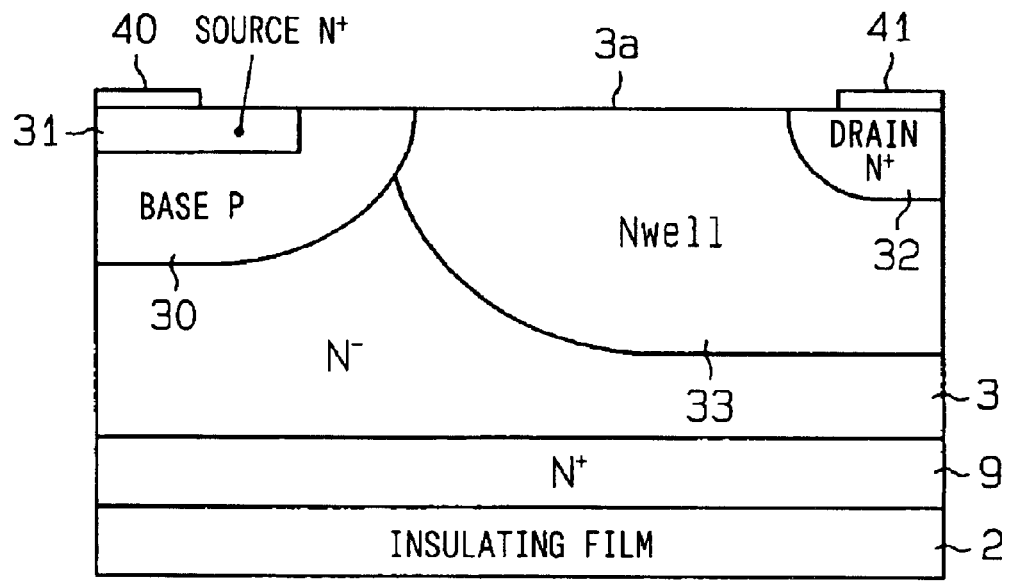
FIG. 29 is a longitudinal sectional view of the transistor along line XXIX—XXIX of FIG. 27.
Figure 30:
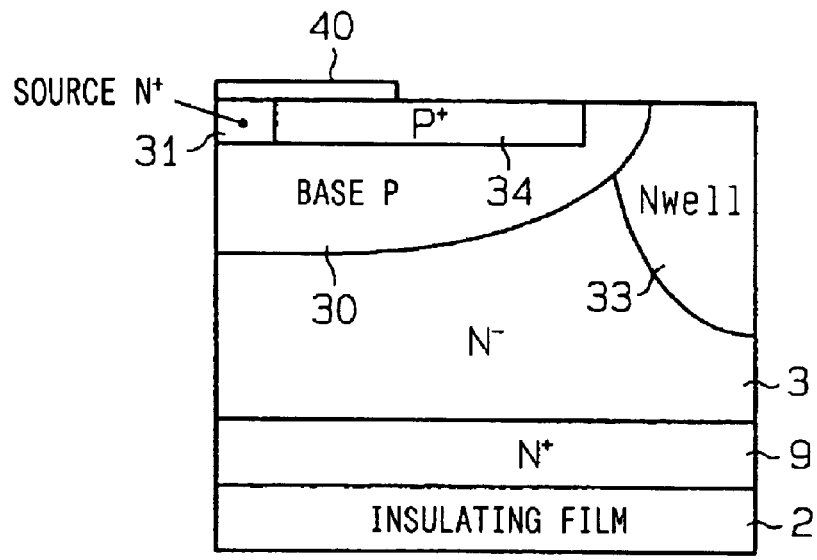
FIG. 30 is a longitudinal sectional view of the transistor along line XXX—XXX of FIG. 27.

FIG. 27 shows a plan view of a horizontal power MOS transistor in this embodiment. FIG. 28 shows a longitudinal sectional view of the transistor along line XXVIII—XXVIII in FIG. 27. FIG. 29 shows a longitudinal sectional view of the transistor along line XXIX—XXIX in FIG. 27. FIG. 30 shows a longitudinal sectional view of the transistor along line XXX—XXX in FIG. 27.

In this embodiment, as shown in FIG. 27, square source cells 42 and square drain cells 43 are arranged alternately lengthwise and crosswise adjacent to each other (the cells are arranged in a matrix shape). Moreover, FIG. 27 also shows a layout of an external circumferential portion of a group of cells.

Figure 31:
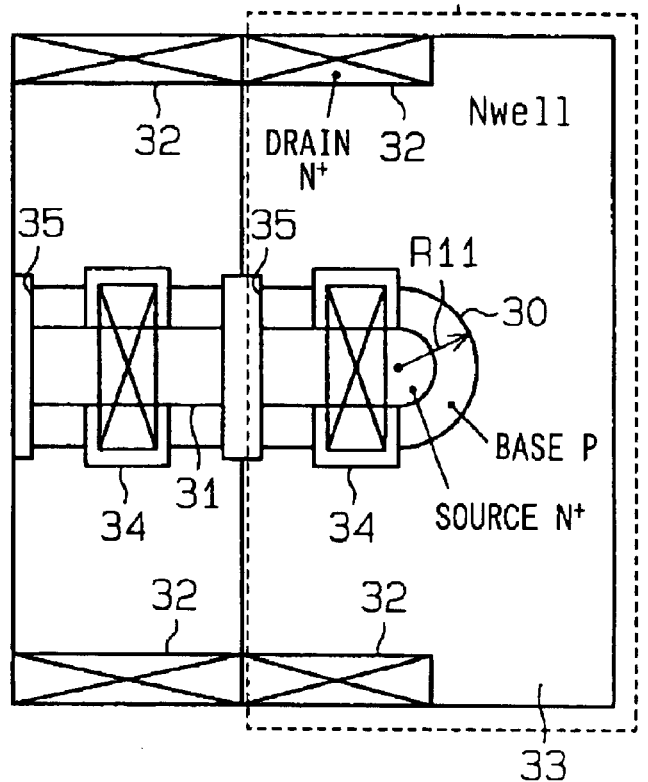
FIG. 31 is a plan view showing a layout of an external circumferential portion in the case in which a layout of a stripe shape is adopted.

FIG. 31 is a plan view of a horizontal power MOS transistor for comparison. The figure shows a layout of an external circumferential portion of a group of cells in the case in which a layout of a stripe shape is adopted unlike this embodiment.

This embodiment will be hereinafter described in detail.

In this embodiment, a layout is adopted in which the source cells 42 and the drain cells 43 are arranged alternately in the plan view of FIG. 27. Each of the cells 42 and 43 is laid out in a square shape, and a length of one side is 6 to 7 μm.

The base P region 30 is formed in the surface layer portion in the source cell 42. In FIG. 27, the base P region 30 is formed in a circular shape. The N well region 33 is formed around the base P region 30, and as shown in FIG. 29, an end of the base P region 30 overlaps an end of the N well region 33 in the surface layer portion. In addition, the source N⁺ region 31 is formed in a cross shape inside the base P region 30. The base contact P⁺ region 34 is formed inside the base P region 30, and the base contact P⁺ region 34 is divided into four regions by the source N⁺ region 31. The trench 35 extends form a tip portion of the source N⁺ region 31 of the cross shape and traverses the base P region 30 to reach the N well region 33. As shown in FIG. 28, the gate electrode 37 is formed inside the trench 35 via the gate oxide film 36.

In the drain cell 43 of FIG. 27, the surface layer portion serves as the N well region 33, and the drain N+ region 32 is formed inside thereof (see FIGS. 28 and 29).

In addition, in FIG. 27, the source cell 42 is formed in the outermost circumferential portion of the group of cells. The outermost circumferential portion is constituted only by the source cell 42 in this way, the following effects are realized compared with the layout in FIG. 31 (layout in the stripe shape).

A mechanism of brake down in the outermost circumference of the group of cells will be described with reference to FIG. 31.

The end of the base P region 30' is formed in a semicircular shape in the outermost circumference of the group of cells, and a PN junction portion between the base P region 30' and the N well region 33' has a radius of curvature R11. In the PN junction portion with the radius of curvature R11, electric fields tend to concentrate, and a hole is easily generated due to impact ionization. The hole turns into a base electric current of a parasitic bipolar to cause a parasitic bipolar operation, and electric currents concentrate on the external circumferential portion to cause destruction.

On the other hand, in FIG. 27, the source cell 42 is formed in the outermost circumferential portion of the group of cells, a PN junction portion between the base P region 30 and the N well region 33 has a radius of curvature R10 in the source cell 42, and this radius of curvature R10 is larger than the radius of curvature R11 in FIG. 31 (R10>R11). In this way, the transistor can be designed without reducing the radius of curvature of the PN junction portion (without increasing a curvature). Therefore, destruction in a corner portion at the time of ESD can be reduced.

In this way, the external circumferential portion is constituted only by the source cell 42 as shown in FIG. 27, whereby surge destruction can be prevented compared with the layout of FIG. 31 (layout of the stripe shape).

In addition, an electrode size in FIG. 27 is as described below.

The drain electrode 41 is formed on the surface of the drain N$^+$ region 32 and has an area in one cell of about 1 $\mu m^2$. However, the source electrode 40 is arranged on the source N$^+$ region 31 and the base contact P$^+$ region 34 and has an area in one cell of about 2 $\mu m^2$. Here, an area of a part of the source electrode 40 existing on the source N+ region 31 is about 1 $\mu m^2$, and a part existing on the base contact P$^+$ region 34 is about 1 $\mu m^2$.

Then, at the time when the device is ON (drain potential: 0.2 volts, gate potential: 7 volts, source potential: 0 volt), an electric current flows from the source N$^+$ regions 31 to the source electrodes 40. At this point, an area of a portion used as an electrode is 1 $\mu m^2$, which is equal to the area of the drain electrode 41. Therefore, deviation of an electric current is reduced, and the electric current flows to each cell uniformly.

In the case in which an electrostatic surge penetrates into the device, since the device operates as a diode, an electric current flows from the base contact P$^+$ region 34 to the source electrode 40 (see FIG. 6). In this case, an area of a portion used as an electrode is about 1 $\mu m^2$, which is equal to the area of the drain electrode 41. Therefore, since deviation of an electric current is reduced, a surge current capacity is improved.

(Eighth Embodiment)

Next, an eighth embodiment will be described by emphasizing differences with the first embodiment.

Figure 32:
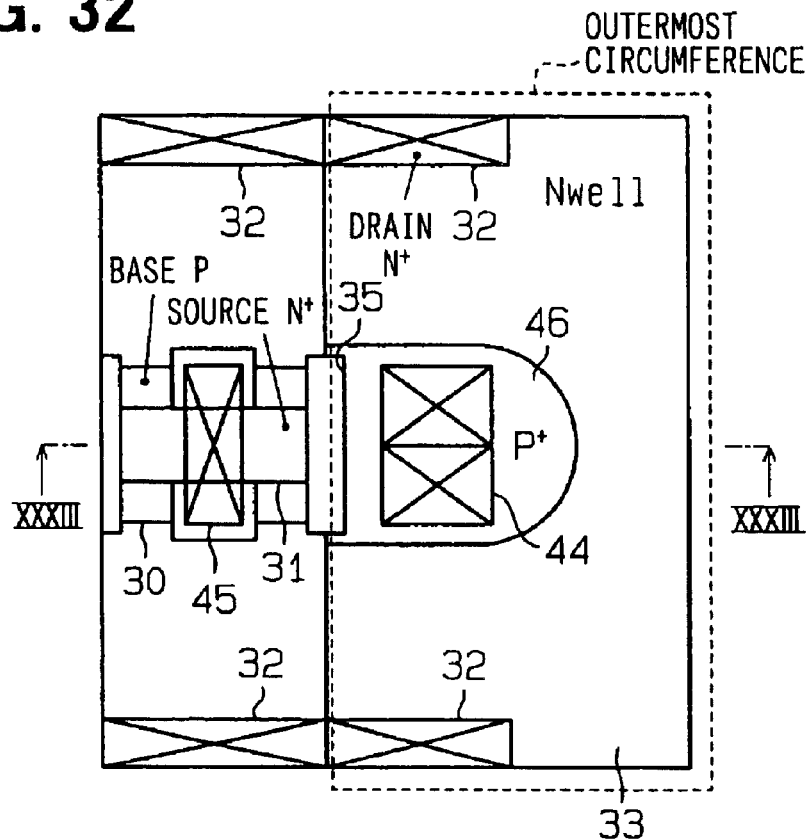
FIG. 32 is a plan view of a horizontal power MOS transistor according to an eighth embodiment.
Figure 33:
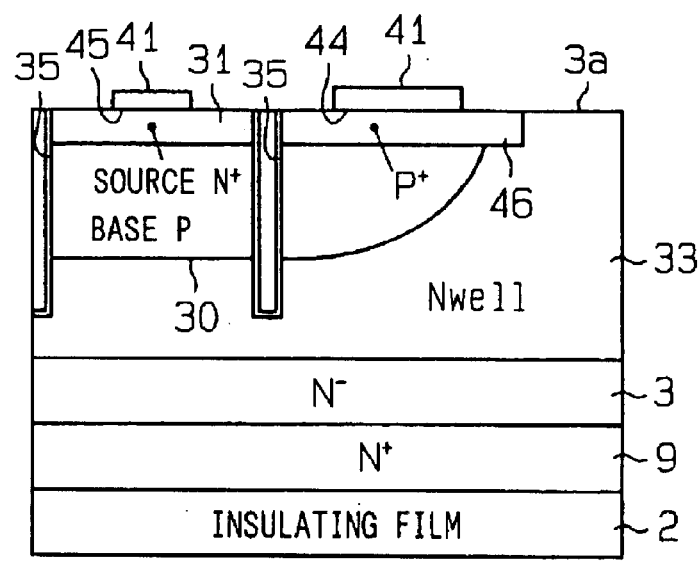
FIG. 33 is a longitudinal sectional view of the transistor along line XXXIII—XXXIII of FIG. 32.

FIG. 32 shows a plan view of a horizontal power MOS transistor in this embodiment. FIG. 33 shows a longitudinal sectional view of the transistor along line XXXIII—XXXIII in FIG. 32.

This embodiment has a structure in which cells in an outermost circumference in a group of cells are different from the other cells. More particularly, at least a source contact 44 in the outermost circumference in the group of cells, in which cells are provided in parallel adjacent to each other, is made larger than an inner source contact 45 (a source contact is large only in the outermost circumference of the group of cells).

In addition, a base contact P$^+$ region 46 is formed in a position where at least the source N$^+$ region 31 in the outermost circumference is planned to be arranged in the group of cells in which cells are provided in parallel adjacent to each other, instead of the source N$^+$ region 31. The base contact P$^+$ region 46 is formed at least in the surface layer portion on the principal surface 3$a$ in the base P region 30 with a higher concentration than the base P region 30 (more specifically, the base contact P$^+$ region 46 is shallower than the base P region 30). More particularly, the source N$^+$ region 31 does not exist in the cells in the outermost circumference in the group of cells, and the P$^+$ region 46 is formed instead of the source n+ region 31. More particularly, as shown in FIG. 33, the surface of the base P region 30 is covered by the P$^+$ region 46.

With this structure, the following effects are realized compared with the structure shown in FIG. 31.

In the stripe structure of FIG. 31, the radius of curvature R11 at the end of the base P region 30' in the outermost circumference of the group of cells is small (curvature is large). Therefore, electric fields tend to concentrate, impact ionization occurs, and a hole is easily generated. The hole turns into a base electric current to turn ON the parasitic NPN transistor, which is formed of the source N$^+$ region 31', the base P region 30', the N region (mainly the N well region 33'), to easily cause electric current concentration destruction due to a specific cell.

On the other hand, in FIGS. 32 and 33, the source N$^+$ region 31 in the outermost circumference of the group of cells is not formed to prevent a parasitic bipolar transistor from being formed. In addition, the P$^+$ region 46 with a high concentration is formed on the surface of the base P region 30, whereby generation of a hole is suppressed. Moreover, the source contact 44 in the outermost circumference of the group of cells is made larger than the inner source contact 45 such that a hole is easily dissipated. In this way, a surge current capacity can be improved.

Note that, if the cells in the vicinity of the outermost circumference in the group of cells are formed with the same structure as those in the outermost circumference, EST endurance is further improved.

(Ninth Embodiment)

Next, a ninth embodiment will be described by emphasizing differences with the eighth embodiment.

Figure 34:
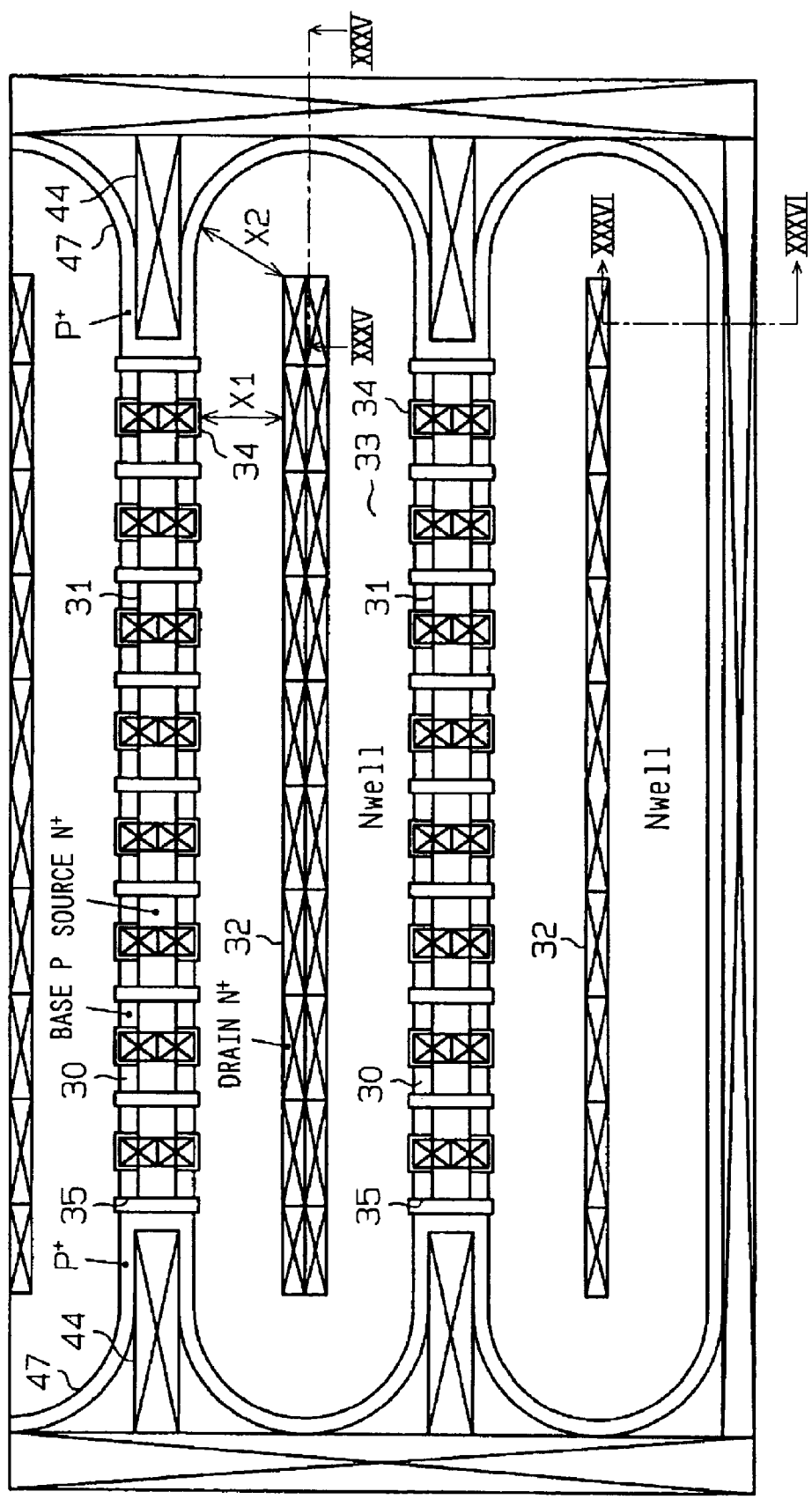
FIG. 34 is a plan view of a horizontal power MOS transistor according to a ninth embodiment.
Figure 35:
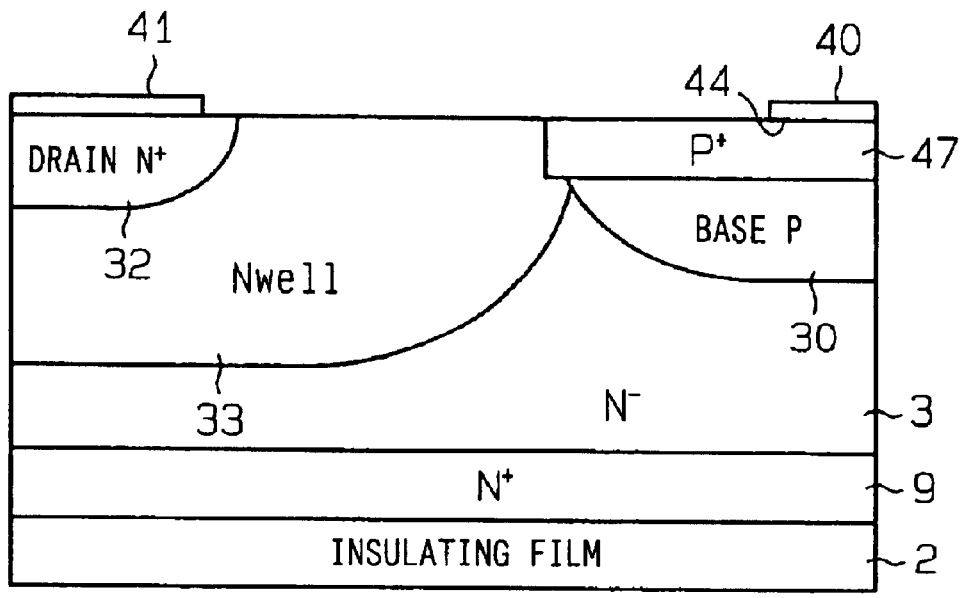
FIG. 35 is a longitudinal sectional view of the transistor along line XXXV—XXXV of FIG. 34.
Figure 36:
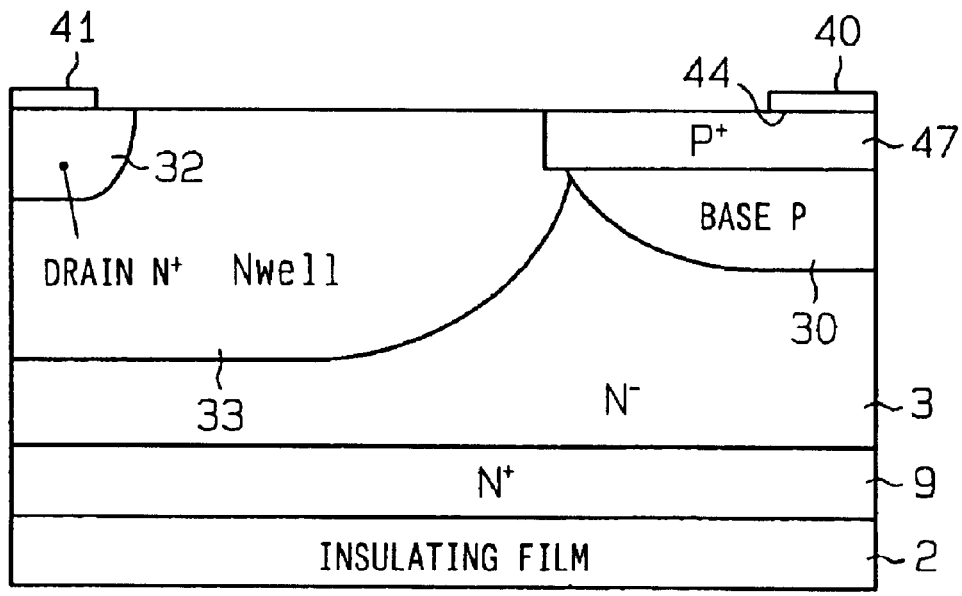
FIG. 36 is a longitudinal sectional view of the transistor along line XXXVI—XXXVI of FIG. 34.

FIG. 34 shows a plan view of a horizontal power MOS transistor in this embodiment. FIG. 35 shows a longitudinal sectional view of the transistor along line XXXV—XXXV in FIG. 34. FIG. 36 shows a longitudinal sectional view of the transistor along line XXXVI—XXXVI in FIG. 34.

As a planar structure, the drain N$^+$ region 32 is surrounded by the source N$^+$ region 31 and the base contact P$^+$ region 47. More particularly, the P$^+$ region 46 in the outermost circumference in the eighth embodiment (FIG. 32) is extended to surround the drain N$^+$ region 32. Simultaneously, the source contact 44 is also formed in the upper portion of the P$^+$ region 47 and arranged so as to surround the drain N$^+$ region 32 in the same manner.

In this case, a diode structure is obtained in which the drain N$^+$ region 32 is a cathode and the P$^+$ region 47 is an anode. This diode can be used as a protective diode by setting a withstand voltage (breakdown voltage) of the diode lower than a withstand voltage (breakdown voltage) of the transistor in the inside. In order to set the withstand voltage (breakdown voltage) low, more specifically, for example, a distance X2 between the drain N$^+$ region 32 and the P+ region 47 in the outermost circumference is set smaller than a distance X1 between the drain N$^+$ region 32 and the base contact P$^+$ region 34 inside the transistor. Thus, in the case in which a surge penetrates into the drain N$^+$ region 32, the following situation occurs. The surge is about to penetrate into the base contact P$^+$ region 34 inside the transistor and the P$^+$ region 47 in the external circumferential portion through the N well region 33. However, since a withstand voltage (breakdown voltage) between the P$^+$ region 47 in the external circumferential portion and the drain N$^+$ region 32 is lower than a withstand voltage between the base contact P$^+$ region 34 inside the transistor and the drain N$^+$ region 32, the surge flows to the external circumferential portion, and the transistor in the inside is protected. In this way, a surge current capacity can be improved.

(Tenth Embodiment)

Next, a tenth embodiment will be described by emphasizing differences with the first to the ninth embodiments.

Figure 37A:
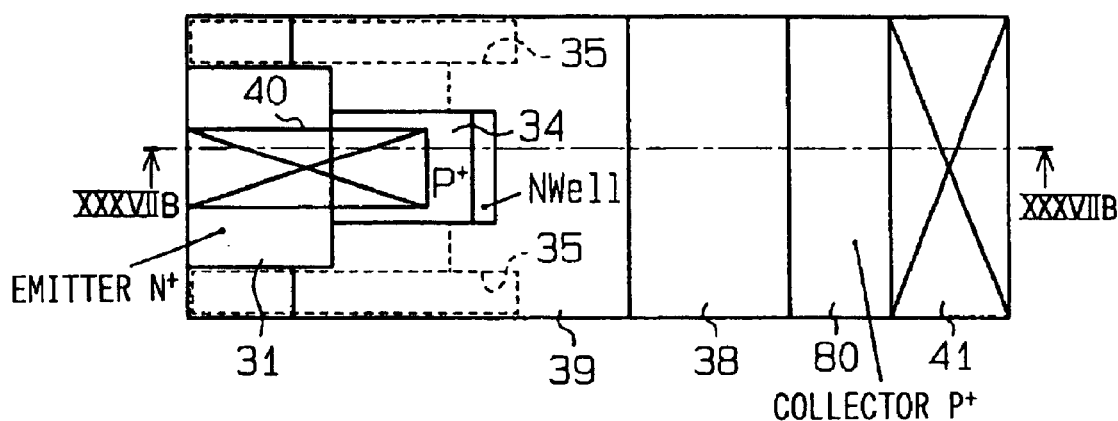
FIGS. 37A–37B are illustrations showing a horizontal power MOS transistor (IGBT) according to a tenth embodiment.
Figure 37B:
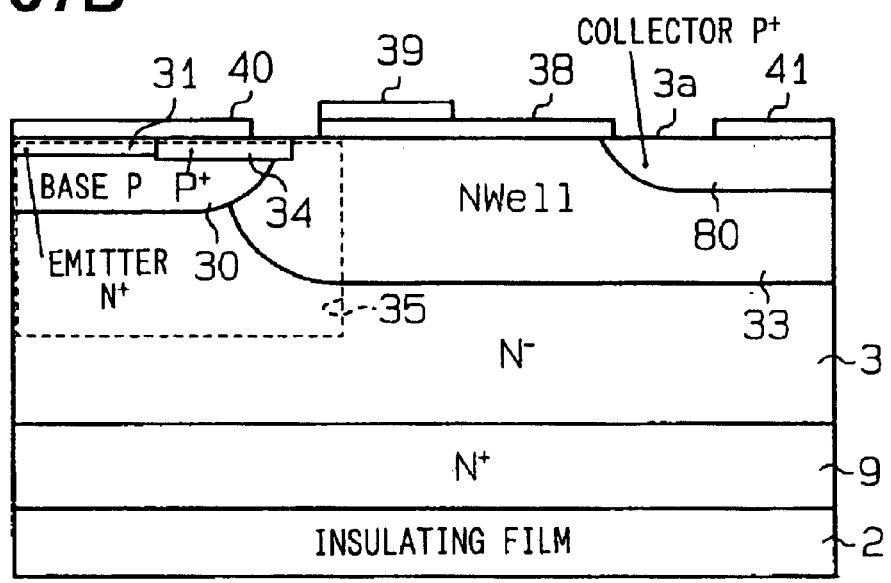

FIGS. 37A–37B show a horizontal power MOS transistor according to this embodiment. A plan view of the transistor is shown in FIG. 37A. A longitudinal sectional view of the transistor is shown FIG. 37B.

In the first to the ninth embodiments, the invention is applied to a MOSFET. However, in this embodiment, the invention is applied to an IGBT (insulating gate type bipolar transistor). More particularly, a P⁺ region 80 is formed instead of the drain N⁺ region 32 in FIG. 3 and is used as a collector region (collector P⁺ region). The source region is turned into an emitter region (emitter N⁺ region 31). In addition, the electrode 40 is turned into an emitter electrode, and the electrode 41 is turned into a collector electrode. The N well region 33 functions as a base region.

A structure in the case in which the invention is applied to the IGBT can be implemented in the same manner as the case of the MOSFET described above (in the same manner as the first to the ninth embodiment).

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A semiconductor device comprising:
   a source region of a first conductivity type;
   a base region of a second conductivity type formed in a surface layer portion on a principal surface in a semiconductor substrate of a first conductivity type, the source region being formed to be shallower than the base region in the surface layer portion on the principal surface in the base region;
   a drain region of the first conductivity type formed in a position apart from the base region in the surface layer portion on the principal surface;
   a well region of the first conductivity type disposed in the surface layer portion on the principal surface and formed to be deeper than the drain region and to have a higher concentration than the semiconductor substrate in a region including the drain region and in contact with the base region;
   a trench formed in the principal surface of the semiconductor substrate to penetrate the base region in a direction toward the drain region from the source region as a planar structure thereof;
   a gate electrode formed via a gate insulating film in the inside of the trench;
   a source electrode electrically connected to the source region; and
   a drain electrode electrically connected to the drain region.

2. A semiconductor device according to claim 1, wherein the concentration of the well region increases continuously from a bottom to a surface.

3. A semiconductor device according to claim 1, wherein, at least in the surface layer portion on the principal surface in the base region, a base contact region of the second conductivity type is shallower and has a higher concentration than the base region and is formed between the source region and the drain region.

4. A semiconductor device according to claim 3, wherein the base contact region is formed apart from the trench, and a gate electrode is formed on the principal surface via a gate insulating film.

5. A semiconductor device according to claim 4, further comprising:
   an embedded layer of the first conductivity type having a higher concentration than the semiconductor substrate formed in a lower portion of the semiconductor substrate, wherein a bottom surface corner portion of the trench is deeper than the well region and shallower than the embedded layer.

6. A semiconductor device according to claim 1, further comprising:
   an embedded layer of the first conductivity type having a higher concentration than the semiconductor substrate formed in a lower portion of the semiconductor substrate, wherein a bottom surface corner portion of the trench is deeper than the well region and shallower than the embedded layer.

7. A semiconductor device according claim 1, further comprising another gate electrode arranged in an opening of the source region on a side of the trench.

8. A semiconductor device according to claim 1, wherein the semiconductor substrate comprises an SOI substrate, and the trench is formed to reach an embedded insulating film of the SOI substrate.

9. A semiconductor device according to claim 1, wherein the semiconductor substrate comprises an SOI substrate, and a thickness of a semiconductor layer on an embedded insulating film in the SOI substrate is substantially equal to a depth of the well region.

10. A semiconductor device according to claim 1, wherein the drain region and the well region form an island shape, and the base region exists around the drain and well regions.

11. A semiconductor device according to claim 1, further comprising a source cell and a drain cell arranged alternately lengthwise and crosswise adjacent to each other.

12. A semiconductor device according to claim 1, further comprising at least a source contact in an outermost circumference in a group of cells provided in parallel adjacent to each other and that is set larger in size than inner source contacts.

13. A semiconductor device according to claim 1, further comprising a base contact region of a second conductivity type having a higher concentration than the base region, wherein the base contact region is formed in at least the surface layer portion on the principal surface in the base region in a position where at least the source region in an outermost circumference in a group of cells provided in parallel adjacent to each other is arranged.

14. A semiconductor device according to claim 13, wherein the drain region is surrounded by the source region and the base contact region as a planar structure.

15. A method of manufacturing the semiconductor device of claim 1, the method comprising:
   arranging an insulating film on the principal surface in which a region where a base contact is to be formed is opened as a contact hole, after forming the base region, the source region, the drain region, the well region, and the trench; and
   performing ion implantation using the insulating film as a mask to form a base contact region apart from the trench in the surface layer portion on the principal surface.

* * * * *

UNITED STATES PATENT AND TRADEMARK OFFICE
CERTIFICATE OF CORRECTION

| | | |
|---|---|---|
| PATENT NO. | : 6,972,458 B2 | Page 1 of 1 |
| APPLICATION NO. | : 10/729955 | |
| DATED | : December 6, 2005 | |
| INVENTOR(S) | : Naohiro Suzuki et al. | |

It is certified that error appears in the above-identified patent and that said Letters Patent is hereby corrected as shown below:

Title Page

Correct the orignal Letters Patent to read as:

(30) Foreign Application Priority Data

October 7, 2003  (JP).............................................2003-348865
    December 18, 2002  (JP)..........................................2002-367067

Signed and Sealed this

Twelfth Day of December, 2006

JON W. DUDAS
*Director of the United States Patent and Trademark Office*